United States Patent
Toma

(10) Patent No.: US 6,737,624 B1
(45) Date of Patent: May 18, 2004

(54) SOLID STATE IMAGING DEVICE AND METHOD OF MANUFACTURING THE SAME

(75) Inventor: Tetsuo Toma, Miyagi (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 25 days.

(21) Appl. No.: 09/680,225

(22) Filed: Oct. 6, 2000

(30) Foreign Application Priority Data

Oct. 8, 1999 (JP) .......................................... 11-288731
Oct. 8, 1999 (JP) .......................................... 11-288732

(51) Int. Cl.[7] ............................................. H01L 27/00
(52) U.S. Cl. .................................. 250/208.1; 348/322
(58) Field of Search .......................... 250/208.1, 214 R, 250/235; 348/322, 297, 298, 320, 311, 315, 302, 305

(56) References Cited

U.S. PATENT DOCUMENTS

| 4,602,289 | A |   | 7/1986 | Sekine ........................ 348/315 |
| 5,907,356 | A | * | 5/1999 | Morimoto .................... 348/311 |
| 6,184,556 | B1 | * | 2/2001 | Yamazaki et al. ........... 257/354 |
| 6,236,434 | B1 | * | 5/2001 | Yamada ....................... 348/315 |

FOREIGN PATENT DOCUMENTS

| JP | 61-244063 | 10/1986 |
| JP | 10136391 A | 5/1998 |
| JP | 2001057418 A | 2/2001 |

OTHER PUBLICATIONS

A. Tanabe et al.; International Electron Devices Meeting 1998. IEDM Technical Digest, San Francisco, CA, Dec. 6–9, 1998, New York, NY: IEEE, US, Dec. 6, 1998, pp. 41–44.*
Webster's New Collegiate Dictionary, G. & C. Merriam Co., p. 1304.*
A. Tanabe et al.; International Electron Devices Meeting 198. IEDM Technical Digest, San Francisco, CA, Dec. 6–9, 1998, New York, NY: IEEE, US, Dec. 6, 1998, pp. 41–44.*
A. Tanabe et al.; International Electron Devices Meeting 1998. IEDM Technical Digest, San Francisco, CA, Dec. 6–9, 1998, New York, NY: IEEE, US, Dec. 6, 1998, pp. 41–44.

* cited by examiner

Primary Examiner—Edward J. Glick
Assistant Examiner—Chih-Cheng Glen Kao
(74) Attorney, Agent, or Firm—Birch, Stewart, Kolasch & Birch, LLP

(57) ABSTRACT

The vertical charge transfer paths 205 have portions (regions A) whose both sides are defined, by the device isolation regions 202 and portions (regions B) whose one side is defined by the device isolation regions 202. The impurity concentration of the device isolation regions 202a used to define both sides is set lower than that of the device isolation regions 202b used to define only one side such that a narrow channel effect in the portions of the vertical charge transfer paths 205, whose both sides are defined, can be reduced.

4 Claims, 23 Drawing Sheets

Portion Corresponding to 202a

PRIOR ART

SOLID STATE IMAGING DEVICE AND METHOD OF MANUFACTURING THE SAME

BACKGROUND OF THE INVENTION

The present invention relates to a solid state imaging device and a method of manufacturing the same.

The solid state imaging device employed in the prior art will be explained with reference to FIG. 14 to FIG. 19 hereunder.

FIG. 14 is a plan view showing a solid state imaging device in the prior art. In FIG. 14, 101 denotes an n-type semiconductor substrate, and a p-well (not shown) made of p-type semiconductor layer is formed on a surface layer portion. Then, a plurality of photoelectric conversion devices 103 that are aligned at a predetermined distance in the column direction (vertical direction in FIG. 14) and the row direction (horizontal direction in FIG. 14) are formed on the p-well.

Charges accumulated in the photoelectric conversion devices 103 are read out to vertical charge transfer paths 105 after a predetermined time has elapsed. Then, a predetermined drive pulse is applied to vertical charge transfer electrodes (not shown) that are formed over the vertical charge transfer paths 105, and thus the charges are transferred toward the downstream (toward lower side in FIG. 14) of the vertical charge transfer paths 105. The vertical charge transfer paths 105 are formed by forming an n-type semiconductor layer on the p-well, and extend substantially in the column direction to pass through between the photoelectric conversion devices 103.

The charges that are transferred in this manner reach eventually a horizontal charge transfer path 106. The charges that reach the horizontal charge transfer path 106 comes up to an output circuit 107 by applying a predetermined drive pulse to a horizontal charge transfer electrode (not shown) that is formed over the horizontal charge transfer path 106. The transferred charges are converted into a predetermined signal at the output circuit 107 and then output to the outside.

FIG. 15 is an enlarged view showing a pertinent portion of the solid state imaging device shown in FIG. 14 in the prior art. In FIG. 15, 104 denotes a read gate portion. The charges accumulated in the photoelectric conversion devices 103 are transferred to the vertical charge transfer paths 105 through the read gate portion 104 by applying a field shift pulse to the vertical charge transfer electrodes (not shown) formed over the read gate portions 104. Also, 102 denotes a device isolation region which is formed by doping high concentration impurity (B (boron)) into the surface layer portion of the p-well. The device isolation regions 102 extend substantially in the column direction to pass through between the photoelectric conversion devices 103.

FIG. 16 is a view showing the solid state imaging device in the prior art to which the vertical charge transfer electrodes 108 that are omitted in FIG. 15 are provided. As shown in FIG. 16, the vertical charge transfer electrode 108 has the well-known one pixel-two electrode structure. The interlace reading is performed by applying the well-known four phase drive pulse to the vertical charge transfer electrodes 108.

FIG. 17 is a view showing an example of such four phase drive pulse. In FIG. 17, VH is a voltage applied when the charges accumulated in respective photoelectric conversion devices 103 are shifted to the vertical charge transfer paths 105 through the read gate portion 104 (when field shifting), and has a voltage of 15 V, for example. Also, VM and VL are voltages applied when the charges in the vertical charge transfer paths 105 are transferred to the downstream, and have a voltage of 0 V and −8 V respectively, for example.

In the solid state imaging device shown in FIG. 15 in the prior art, the vertical charge transfer path 105 in a region A and a region B have following features. That is, in the region A, the device isolation region 102 is formed only on one side of the vertical charge transfer path 105. In other words, only one side of the vertical charge transfer path 105 in the region A is defined by contacting to the device isolation region 102.

In contrast, in the region B, the device isolation region 102 is formed on both sides of the vertical charge transfer path 105. In other words, both sides of the vertical charge transfer path 105 in the region B are defined by contacting to the device isolation region 102.

Therefore, an amount of the impurity (B (boron)) that diffuses from the device isolation region 102 into the vertical charge transfer path 105 in the region B is increased rather than that in the region A. The reason for this can be given as follows. That is, in the region A, since the device isolation region 102 is formed only on one side of the vertical charge transfer path 105, diffusion of the impurity (B (boron)) occurs only from this device isolation region 102 formed on one side. On the contrary, in the region B, since the device isolation region 102 is formed on both sides of the vertical charge transfer path 105, diffusion of the impurity (B (boron)) occurs from both sides of the vertical charge transfer path 105. Accordingly, an amount of the impurity (B (boron)) that diffuses into the vertical charge transfer path 105 in the region B is increased rather than that in the region A.

In general, if the impurity is diffused into the vertical charge transfer path 105, a height of potential of the vertical charge transfer path 105 is increased by the so-called narrow channel effect. Then, if an amount of diffused impurity is different between the region A and the region B, the height of potential of the vertical charge transfer path 105 in the region B becomes higher than that in the region A.

This point will be explained with reference to FIGS. 18A and 18B and FIG. 19 hereunder. FIG. 18A is a view showing a sectional shape of the solid state imaging device in the prior art, taken along a C-D line in FIG. 15, and a schematic behavior of potential in the sectional shape. FIG. 18B is a view showing a sectional shape of the solid state imaging device in the prior art, taken along an E-F line in FIG. 15, and a schematic behavior of potential in the sectional shape. In FIGS. 18A and 18B, the vertical charge transfer electrodes 108 (108a, 108b) that are omitted in FIG. 15 are also shown. Also, as is evident from FIG. 15, a C-D sectional shape is one sectional shape in the region A, and an E-F sectional shape is one sectional shape in the region B.

Also, a curve indicated by a solid line in FIGS. 18A and 18B shows potential when the voltage applied to the vertical charge transfer electrodes (108a, 108b) is at a low level (VL), while a curve indicated by a broken line shows potential when the applied voltage is at a middle level (VM).

As shown in FIG. 18A, in the C-D sectional shape in FIG. 15, when the voltage applied to the vertical charge transfer electrode 108a is at a low level (VL), a height of potential of the vertical charge transfer path 105 is HL1. Then, when the applied voltage is at a middle level (VM), the height of potential of the vertical charge transfer path 105 is HM1.

In contrast, as shown in FIG. 18B, in the E-F sectional shape in FIG. 15, when the voltage applied to the vertical charge transfer electrode 108b is at a low level (VL), a height of potential of the vertical charge transfer path 105 is HL2. Then, when the applied voltage is at a middle level (VM), the height of potential of the vertical charge transfer path 105 is HM2.

Because of the aforementioned difference in the amount of diffused impurity (B (boron)), HL1 is higher than HL1 (HL2>HL1), and HM2 is higher than HM1 (HM2>HM1).

FIG. 19 is a view showing a sectional shape of the solid state imaging device in the prior art, taken along a G-H line in FIG. 16, and a schematic behavior of potential in the sectional shape. A curve indicated by a solid line in FIG. 19 shows behavior of potential in the G-H sectional shape when the voltage applied to the vertical charge transfer electrode 108a is at a low level (VL) and the voltage applied to the vertical charge transfer electrode 108b is at a middle level (VM). Also, a curve indicated by a broken line in FIG. 19 shows behavior of the potential when the voltage applied to both the vertical charge transfer electrodes 108a and 108b is at a middle level (VM).

As described above, when the voltage applied to the vertical charge transfer electrode 108a is at a low level (VL), HL2 is higher than HL1. Therefore, as shown in FIG. 19, when the voltage applied to the vertical charge transfer electrode 108a is at a low level (VL) and the voltage applied to the vertical charge transfer electrode 108b is at a middle level (VM), a convex portion whose height is HL2-HL1 is formed in the potential of the vertical charge transfer path 105 in the neighborhood of a coherent region between the region A and the region B.

If such convex portion is formed, motion of the charges that are to be transferred from the left to the right in FIG. 19 is disturbed by the convex portion and cannot be transferred as desired, and thus a vertical transfer efficiency of the solid state imaging device becomes worse. If the vertical transfer efficiency is degraded in this manner, the characteristics of the overall solid state imaging device also become worse.

SUMMARY OF THE INVENTION

It is an object of the present invention to provide a solid state imaging device capable of preventing deterioration of a vertical transfer efficiency due to a narrow channel effect and a method of manufacturing the same.

According to the solid state imaging device of the present invention, a plurality of photoelectric conversion devices are formed on the semiconductor substrate at predetermined intervals in a column direction and a row direction respectively. A plurality of device isolation regions is formed on the semiconductor substrate to extend substantially in a column direction. Each of a plurality of device isolation regions extends also in a zigzag direction to pass through between the photoelectric conversion devices. The device isolation regions contain first conductivity type semiconductor layers.

Also, vertical charge transfer paths are formed between the adjacent device isolation regions on the semiconductor substrate, and contain first conductivity type semiconductor layers. The vertical charge transfer paths are formed to extend in a zigzag and substantially in column direction to pass through between the photoelectric conversion devices The vertical charge transfer paths have a portion whose both sides are defined by the device isolation regions and a portion whose only one side is defined by the device isolation regions. Then, in the present invention, an impurity concentration of the device isolation regions defining the both sides is lower than that of the device isolation regions defining the only one side, so as to reduce the narrow channel effect in the portions of the vertical charge transfer paths whose both sides are defined by the device isolation region.

Accordingly, the situation where the convex portion of potential is formed in the vertical charge transfer paths by the narrow channel effect cannot arise. Thus, the charges in the vertical charge transfer paths can be transferred smoothly and also degradation of the vertical charge transfer efficiency can be prevented.

According to another solid state imaging device of the present invention, the width of the device isolation region that defines both sides of the path is narrower than that of the device isolation region that defines only one side of the path. According to this structure, since an amount of the impurity being diffused from the portion of the device isolation region, which defines both sides of the path, into the vertical charge transfer path can be reduced, the narrow channel effect can be reduced.

Also, according to still another solid state imaging device of the present invention, the vertical charge transfer path has at least (i) first transfer portion whose only one side is defined by contacting the device isolation regions and (ii) second transfer portions whose both sides are defined by contacting the device isolation regions. The first transfer portion and the second transfer portion are connected in the coherent regions located in a downward of the first transfer portions. Then, the vertical charge transfer electrodes are arranged in such a way that one edge portion of the vertical charge transfer path is positioned in vicinity of the coherent regions.

If the vertical charge transfer electrodes are arranged in this manner, the convex portion of potential does not exist in the vertical charge transfer paths since the fringing electric field generated by one edge portion of the vertical charge transfer electrode is canceled by the convex portion of potential in the vertical charge transfer paths in vicinity of the coherent regions by the narrow channel effect. Thus, the transfer of the charges in the vertical charge transfer path can be made smoothly, and also the degradation of the vertical charge transfer efficiency can be prevented.

Also, according to the solid state imaging device manufacturing method of the present invention, there is contained the step of preparing a substrate on which a plurality of photoelectric conversion devices are formed at predetermined intervals in a column direction and a row direction respectively. Then, after this step, there is executed the step of forming a vertical charge transfer path that extend in a zigzag and substantially in a column direction to pass through between the photoelectric conversion devices, by doping a first impurity into portions of the substrate that correspond to the vertical charge transfer path. Then, after this step, there is executed, the step of forming device isolation region that defines one side of the vertical charge transfer path, by doping a second impurity into portions of the vertical charge transfer path, that correspond to the one side.

According to this method, since the first impurity and the second impurity are compensated with each other, the substantial impurity concentration in the device isolation region that define only one side of the path can be reduced.

DETAILED DESCRIPTION OF THE PREFERRED EMBODIMENTS

Embodiments of the present invention will be explained in detail with reference to the accompanying drawings hereinafter.

(1) Explanation of a Solid State Imaging Device According to a First Embodiment of the Present Invention The solid state imaging device according to the first embodiment of the present invention will be explained with reference to FIG. 1 to FIG. 7 hereunder.

Figure 1:
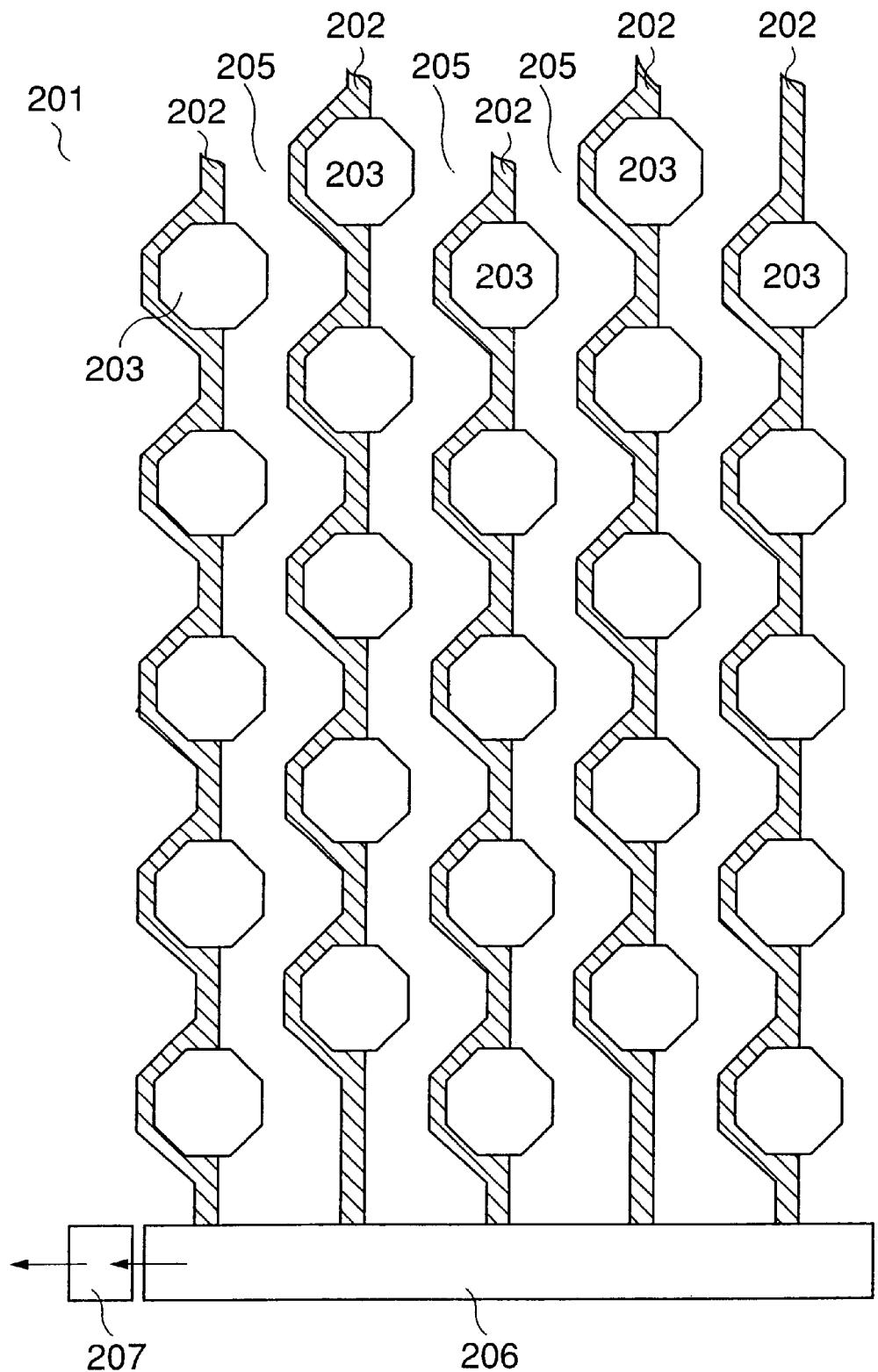
FIG. 1 is a plan view showing an overall solid state imaging device according to a first embodiment (third embodiment) of the present invention.
Figure 2:
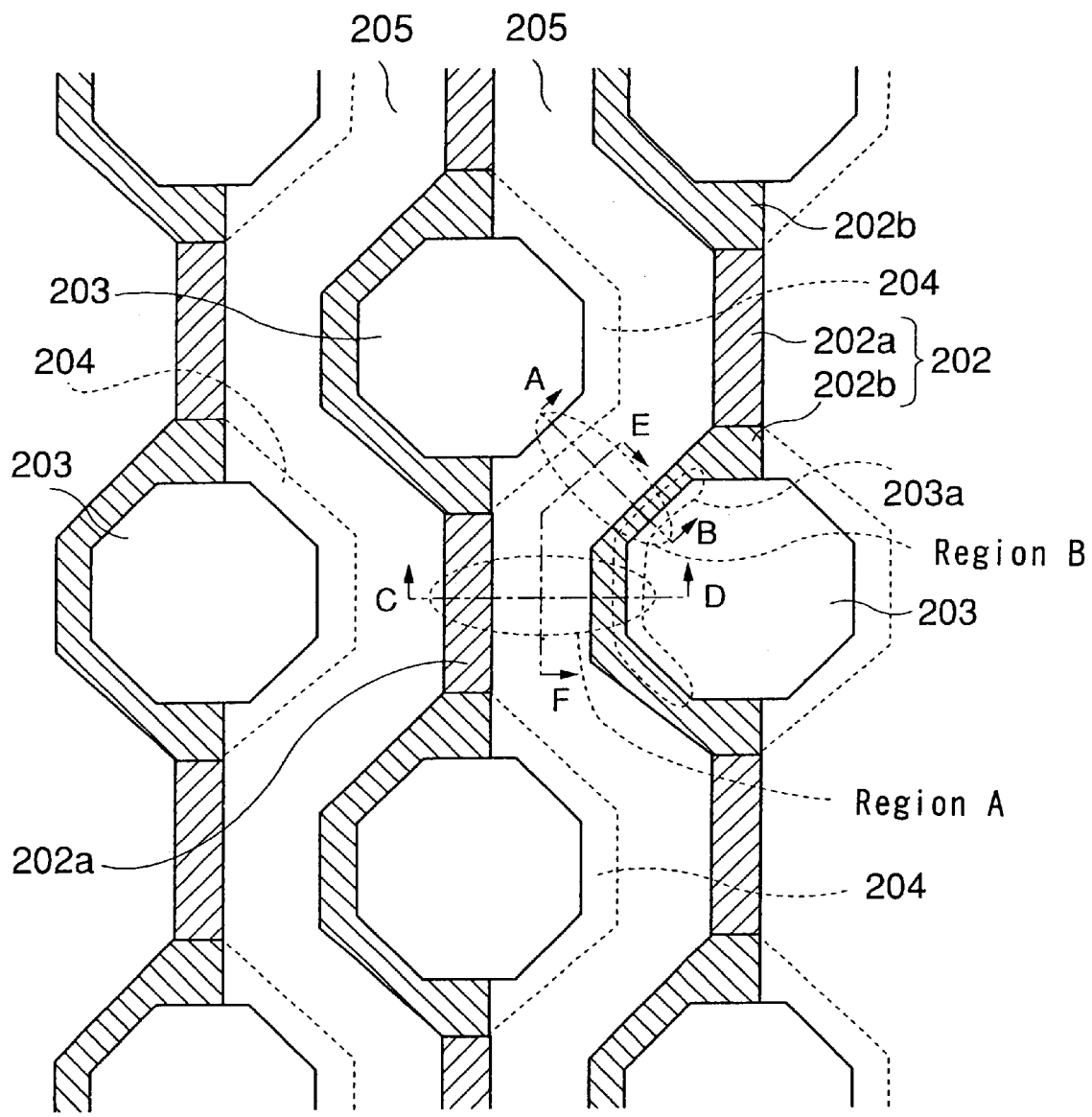
FIG. 2 is an enlarged view showing a pertinent portion of the solid state imaging device according to the first embodiment of the present invention.

FIG. 1 is a plan view showing an overall solid state imaging device according to the first embodiment of the present invention, and FIG. 2 is an enlarged view showing a pertinent portion of the solid state imaging device in FIG. 1.

In FIG. 1, 201 denotes an n-type semiconductor substrate, and a p-well (not shown) made of p-type semiconductor layer is formed on a surface layer portion of the substrate. Then, a plurality of photoelectric conversion devices 203 are formed on the p-well at a predetermined distance in the column direction (vertical direction in FIG. 1) and in the row direction (horizontal direction in FIG. 1) respectively. The photoelectric conversion devices 203 are made up of photodiodes (not shown) formed in the p-well having pn-junction. Then, 202 denotes a device isolation region which is formed by forming high concentration p-type semiconductor layer (first conductivity type semiconductor layer) on the p-well. The device isolation regions 202 are formed by doping B (boron) into the p-well, where the B (boron) is an example of the impurity. Then, as shown in FIG. 1, a plurality of device isolation regions 202 are allayed in the row direction. The device isolation regions 202 are formed between the photoelectric conversion devices 203, and extend in zigzag and substantially in the column direction Also, 205 denotes a vertical charge transfer path. The charges that are read from the photoelectric conversion devices 203 are transferred downward in FIG. 1 through the vertical charge transfer paths 205. It should be remembered here that in the specification and claim the term downward means the direction to which the charges in the vertical charge transfer path 205 are transferred. It should be also noted that the downward direction is substantially identical to the column direction.

The vertical charge transfer paths 205 are formed between the device isolation regions 202 that is adjacent to each other, and also formed so as to extend in zigzag and substantially in the column direction while passing trough between the photoelectric conversion devices 203. Also, the vertical charge transfer paths 205 are made up an n-type semiconductor layer (second conductivity type semiconductor layer) which is formed on the above p-well.

The charges transferred through the vertical charge transfer paths 205 eventually reach a horizontal charge transfer path 206. Then, the charges that arrive at the horizontal charge transfer paths 206 are transferred in the horizontal direction, and then reach an output circuit 207. The transferred charges are converted into a predetermined signal by the output circuit 207 and then output to the outside. The transfer of the charges in the vertical direction and in the horizontal direction is carried out by applying a predetermined drive pulse to the vertical charge transfer electrodes and the horizontal charge transfer electrode respectively, where both of the electrodes are not shown in FIG. 1. Also, the n-type semiconductor substrate 201 is grounded.

Next, the above solid state imaging device will be explained in detail with reference to FIG. 2 hereunder. In FIG. 2, 204 denotes a read gate portion. When a field shift pulse is applied to the vertical charge transfer electrodes (not shown in FIG. 2) that are formed over the read gate portions 204, the charges accumulated in the photoelectric conversion devices 203 are caused to move to the vertical charge transfer paths 205 through the read gate portion 204.

Also, the device isolation regions 202 are formed so as to contact with one side portions 203a of respective photoelectric conversion devices 203 that are allayed in the column direction (in the vertical direction in FIG. 2). In addition, the device isolation region 202 is formed to connect (but not electrically) two photoelectric conversion devices 203 positioned adjacently in the column direction. In other words, the device isolation region 202 consists of a device isolation region 202b (first portion) that is in contact with one side portion 203a of the photoelectric conversion device 203, and a device isolation region 202a (second portion) that extends in the column direction to connect mutually (but not electrically) the device isolation region 202b positioned adjacently in the column direction.

Also, in the region B in FIG. 2, the device isolation region is formed on only one side of the vertical charge transfer paths 205. That is, the device isolation region 202b (first portion) that is in contact with one side portion 203a of the photoelectric conversion device 203 is formed on only one side of the vertical charge transfer paths 205 in this region. In other words, only one side of the vertical charge transfer paths 205 in the region B is defined by the device isolation region 202b. The region B is referred to as a first transfer region in the first embodiment.

In contrast, in the region A in FIG. 2, the device isolation region is formed on both sides of the vertical charge transfer paths 205. That is, the device isolation region 202b is formed on one side (right-hand side in FIG. 2) of the vertical charge transfer paths 205, and the device isolation region 202a is formed on the other side (left-hand side in FIG. 2) of the vertical charge transfer paths 205. In other words, both sides of the vertical charge transfer paths 205 in the region A are defined by the device isolation regions 202a and 202b. The region A is referred to as a second transfer region in the first embodiment.

Then, the solid state imaging device according to the first embodiment, the concentration of the impurity (B (boron)) in the device isolation region 202a (second portion) is set lower than that in the device isolation region 202b (the first portion).

Figure 3:
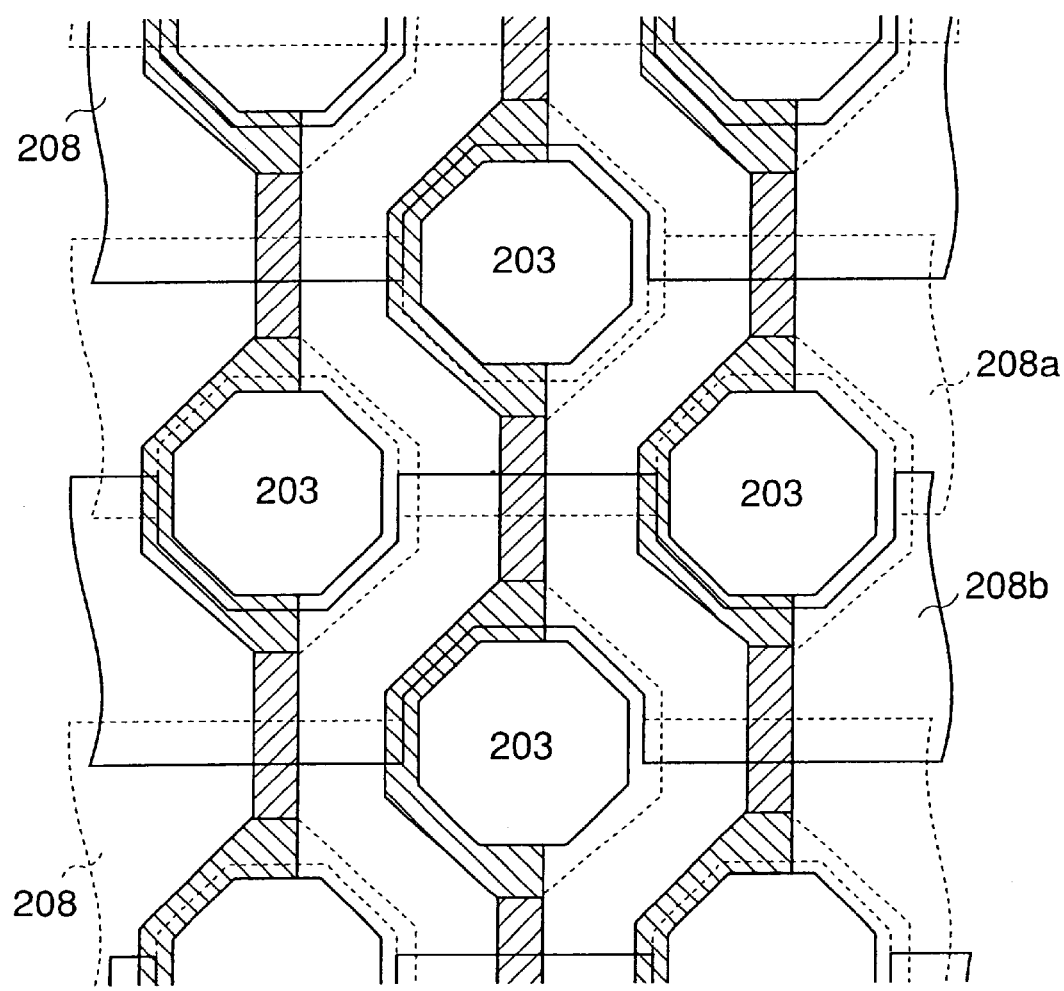
FIG. 3 is a view showing the solid state imaging device shown in FIG. 2 according to the first embodiment of the present invention to which electrodes are provided.

FIG. 3 shows the solid state imaging device according to the first embodiment of the present invention to which vertical charge transfer electrodes 208 (208a, 208b) that are omitted in FIG. 2 are provided. As shown in FIG. 3, the vertical charge transfer electrodes 208 have the well-known one pixel-two electrode structure. The well-known four phase drive pulse is applied to the vertical charge transfer electrode 208. The time change of the four phase drive pulse is similar to that explained in the prior art and shown in FIG. 17.

The behavior of potential in the vertical charge transfer path 205 in the region A (the second transfer region) in FIG. 2 will be explained with reference to FIGS. 4A, 4B, and FIG. 5 hereunder.

Figure 4A:
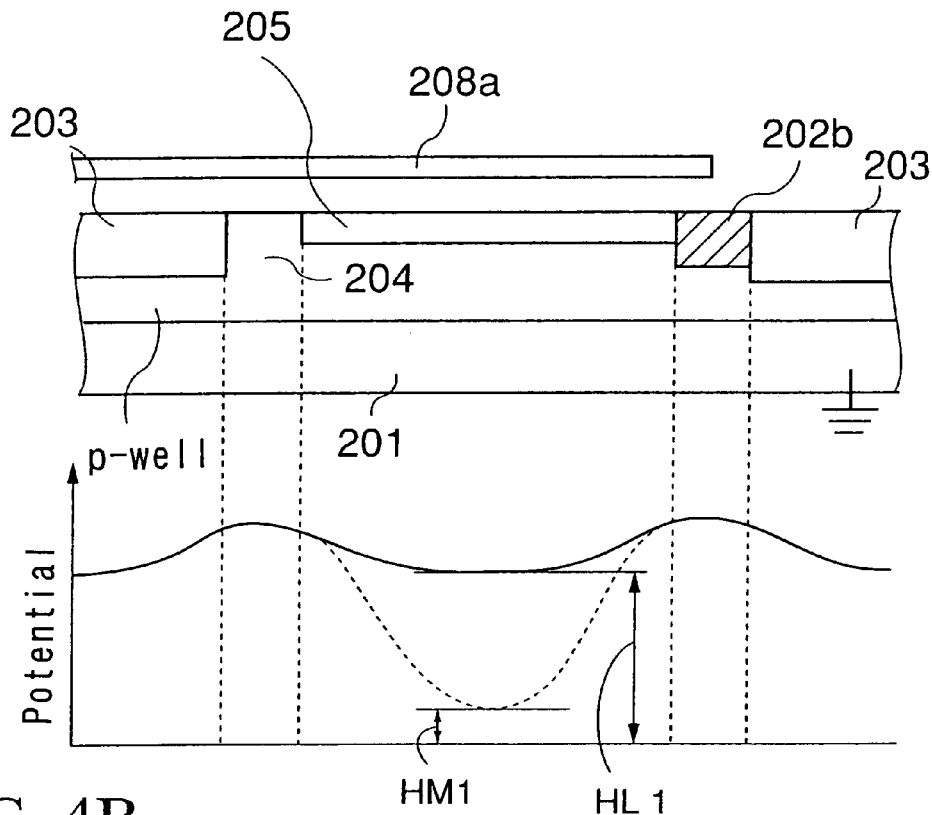
FIG. 4A is a view showing a sectional shape of the solid state imaging device shown in FIG. 2 according to the first embodiment of the present invention and a schematic behavior of potential in the sectional shape.

FIG. 4A is a view showing an A-B sectional shape of the solid state imaging device shown in FIG. 2 according to the first embodiment of the present invention and a schematic behavior of potential in the sectional shape. FIG. 4B is a view showing a C-D sectional shape of the solid state imaging device shown in FIG. 2 according to the first embodiment of the present invention and a schematic behavior of potential in the sectional shape. Here, the A-B sectional shape in FIG. 2 is one sectional shape in the region B (the first transfer region) in FIG. 2, and the C-D sectional shape is one sectional shape in the region A (the second transfer region). It should be noted that the vertical charge transfer electrodes 208a, 208b that are omitted in FIG. 2 are also illustrated in FIGS. 4A and 4B.

In FIG. 4A, a curve indicated by a solid line denotes potential in the A-B sectional shape when the voltage of the four phase drive pulse applied to the vertical charge transfer electrode 208a is at a low level (VL), and a curve indicated by a broken line denotes potential in the A-B sectional shape when the voltage is at a middle level (VM). As shown in FIG. 4A, a height of potential in the vertical charge transfer paths 205 is HL1 when the voltage of the four phase drive pulse is at a low level (VL), and the height of potential in the vertical charge transfer paths 205 is HM1 when the voltage is at a middle level (VM).

Figure 4B:
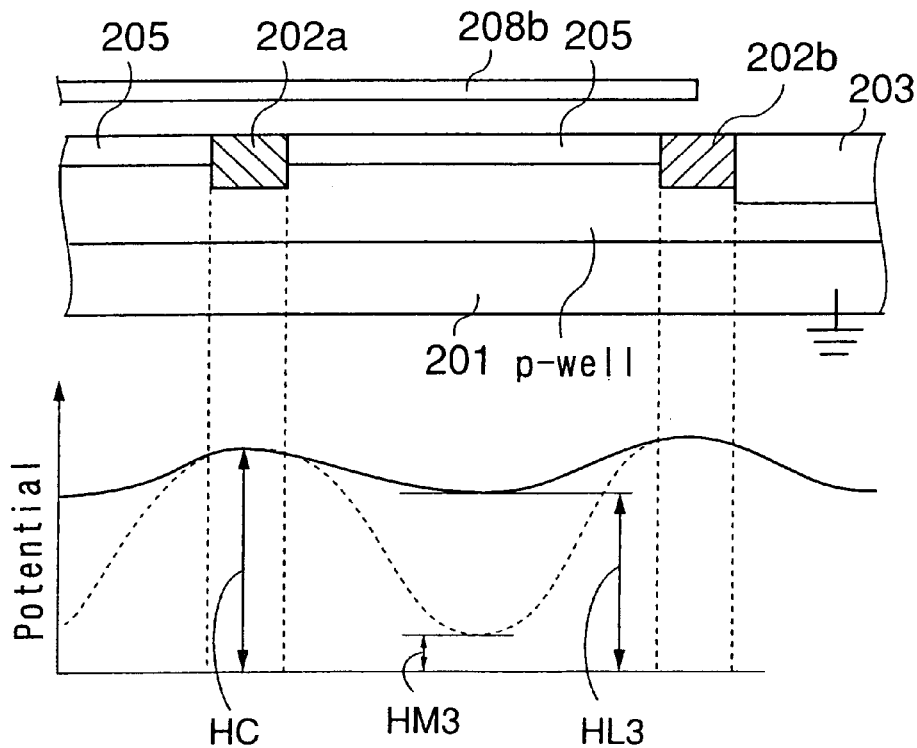
FIG. 4B is a view showing both another sectional shape of the solid state imaging device shown in FIG. 2 according to the first embodiment of the present invention and a schematic behavior of potential in the sectional shape.

Similarly, in FIG. 4B, a curve indicated by the solid line denotes potential in the C-D sectional shape when the voltage of the four phase drive pulse applied to the vertical charge transfer electrode 208b is at the low level (VL), and a curve indicated by the broken line denotes potential in the C-D sectional shape when the voltage is at the middle level (VM). Then, HL3 and HM3 are the height of the potential in the vertical charge transfer paths 205 when the voltage of the four phase drive pulse is at the low level (VL) and the middle level (VM) respectively.

As described above, in the solid state imaging device according to the first embodiment, the impurity (B (boron)) concentration of the device isolation region 202a (second portion) is set lower than that in the device isolation region 202b (first portion). According to this, an amount of the impurity that is diffused from the device isolation region 202a (second portion) to the vertical charge transfer path 205 can be reduced compared with the prior art. Then, because an amount of the impurity that is diffused to the vertical charge transfer path 205 can be reduced, a narrow channel effect in the vertical charge transfer path 205 in the region A (the second transfer region) can be reduced.

As a result, when the voltage of the four phase drive pulse is at the low level (VL), the potential (HL1) of the vertical charge transfer path 205 in the A-B sectional shape in FIG. 2 can be set substantially equal to the potential (HL3) of the vertical charge transfer path 205 in the C-D sectional shape. Similarly, when the voltage of the four phase drive pulse is at the middle level (VM), the potential (HM1) of the vertical charge transfer path 205 in the A-B sectional shape can be set substantially equal to the potential (HM3) of the vertical charge transfer path 205 in the C-D sectional shape.

Figure 5:
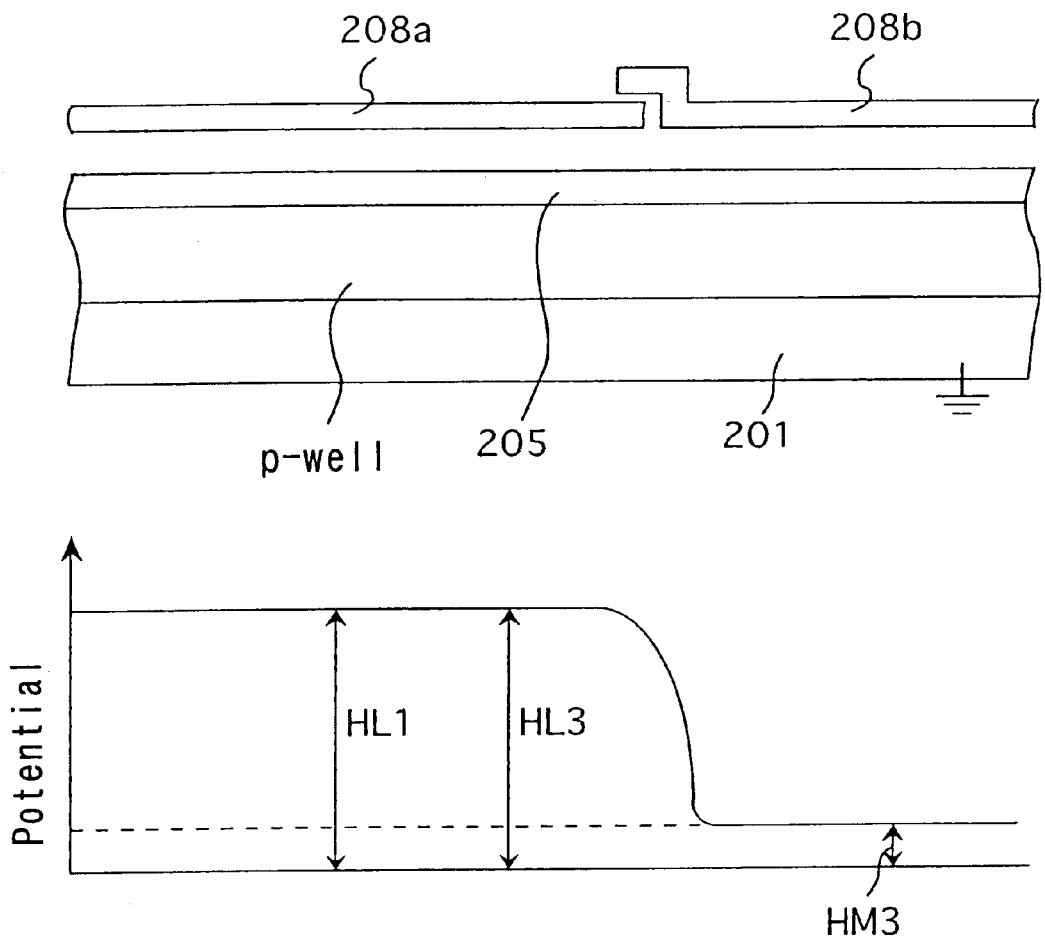
FIG. 5 is a view showing still another sectional shape of the solid state imaging device shown in FIG. 2 according to the first embodiment of the present invention and a schematic behavior of potential in the sectional shape.

FIG. 5 is a view showing an E-F sectional shape of the solid state imaging device shown in FIG. 2 and a schematic behavior of potential in the sectional shape. It should be noted that the vertical charge transfer electrodes 208a and 208b that are omitted in FIG. 2 are also illustrated in FIG. 5.

A curve indicated by a solid line in FIG. 5 shows behavior of potential in the situation where the charges reside in the vertical charge transfer path 205 is transferred in the vertical direction (left to right direction in FIG. 5). In this situation, the pulse voltages applied to the vertical charge transfer electrodes 208a and 208b are at the low level (VL) and the middle level (VM) respectively. Then, a curve indicated by a broken line shows the behavior of potential when the pulse voltages applied to the vertical charge transfer electrodes 208a and 208b are both at the middle level (VM).

As shown in FIG. 5, in the solid state imaging device according to the first embodiment, when the pulse voltages applied to the vertical charge transfer electrodes 208a and 208b are at the low level (VL) and the middle level (VM) respectively, the convex portion in potential that occurs in the prior art is not formed. As described above, this is because the potential (HL1) of the vertical charge transfer path 205 in the A-B sectional shape in FIG. 2 can be set substantially equal to the potential (HL3) of the vertical charge transfer path 205 in the C-D sectional shape. Therefore, the charges to be transferred from the left to the right in FIG. 5 are not disturbed by the convex portion in potential, and thus they can be moved smoothly.

By the way, the impurity concentration in the device isolation region 202a (second portion) cannot be arbitrarily reduced. That is, the potential of the device isolation region 202a must be set higher to such extent that the charges in the neighboring vertical charge transfer paths 205 are not mixed with each other.

This point will be explained with reference to FIG. 4B hereunder. As shown in FIG. 4B, the vertical charge transfer paths 205 are formed on both sides of the device isolation region 202a (second portion). In FIG. 4B, HC denotes a height of potential in the device isolation region 202a, and this height is decided by the impurity concentration in the device isolation region 202a (the second portion).

In the event that the applied pulse voltage is at the low level (VL), the potential of the vertical charge transfer path 205 whose potential height is HL3 is formed on both sides of the potential of the device isolation region 202a whose potential height is HC. At this time, in order to prevent the leakage of the charges in the vertical charge transfer path 205 on one side of the device isolation region 202a into the vertical charge transfer path 205 on the other side, the potential height HL3 must be set lower than HC.

In the meanwhile, in the case where the semiconductor substrate 201 is grounded and the negative voltage is applied to the vertical charge transfer electrodes 208b formed over the vertical charge transfer paths 205, the potential of the vertical charge transfer paths 205 cannot be reduced lower than a particular value even if a voltage that is lower than a particular voltage is applied. This particular voltage is called a pinning voltage.

In general, the pinning voltage of the vertical charge transfer paths 205 is employed as the low level (VL) pulse voltage applied to the vertical charge transfer electrodes 208a, 208b. Therefore, when the applied pulse is at the low level (VL) (i.e., the pinning voltage), the potential (HL3) of the vertical charge transfer paths 205 becomes equal to the pinning potential of the vertical charge transfer paths 205.

For this reason, the impurity concentration of the device isolation region 202a (the second portion) must be decided to such extent that the potential of the device isolation region 202a is not reduced lower than the pinning potential of the vertical charge transfer paths 205.

In the above, in order to reduce the narrow channel effect in the vertical charge transfer paths 205 in the region A (the second transfer region) in FIG. 2, the impurity concentration of the device isolation region 202a (second portion) is set lower than that in the device isolation region 202b (first portion). However, the structure for reducing the narrow channel effect in the vertical charge transfer paths 205 is not limited to this.

Figure 6:
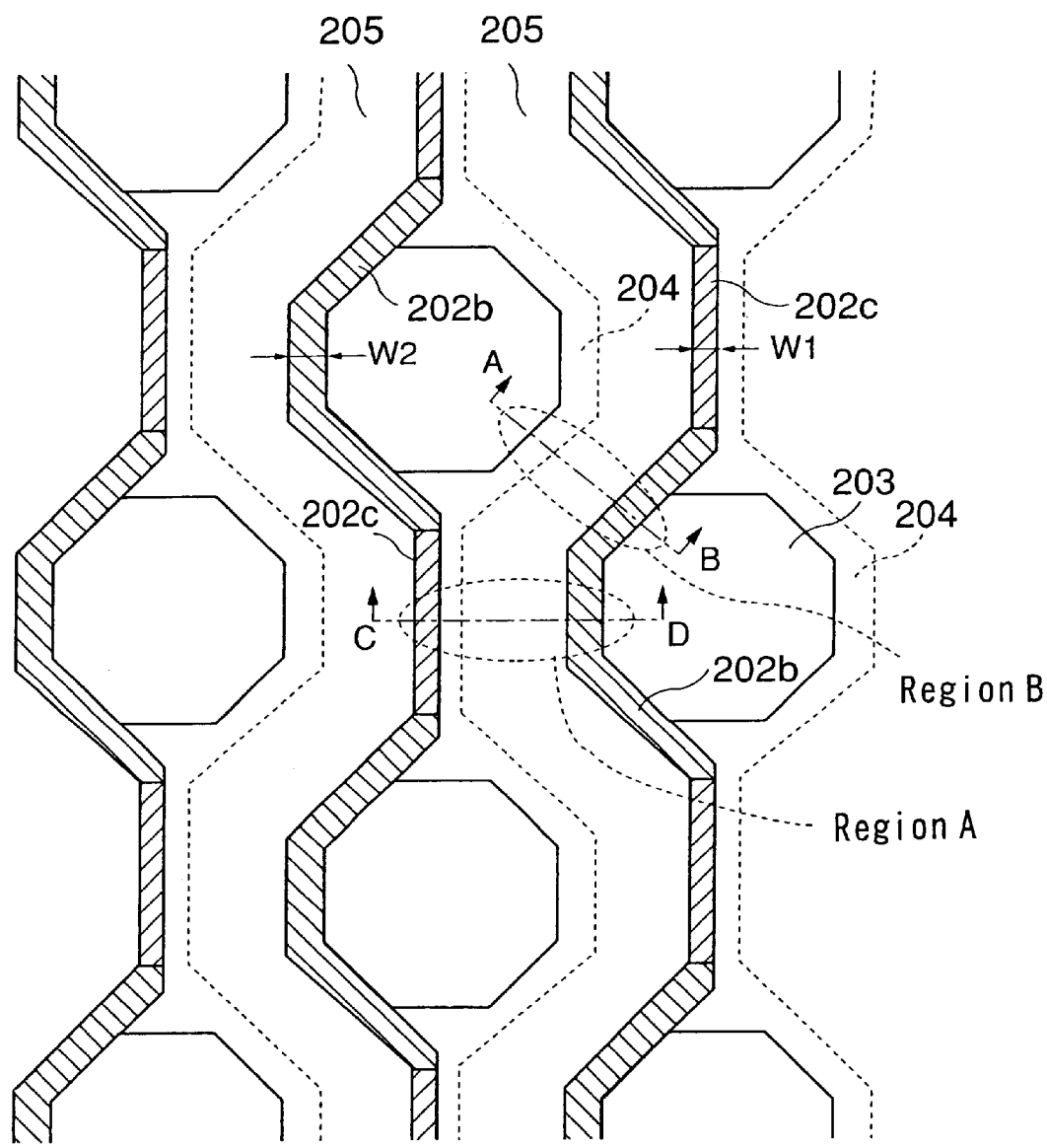
FIG. 6 is a view showing another example of the solid state imaging device according to the first embodiment of the present invention.

FIG. 6 is a view showing another structure that is invented by the inventors of this application to reduce the narrow channel effect in the vertical charge transfer paths 205 in the region A (the second transfer region) in FIG. 2. In FIG. 6, the constituent members that are the same as in FIG. 2 are affixed with the same reference numeral and their explanation is omitted in the followings.

Different respects of the structure shown in FIG. 6 from that shown in FIG. 2 are that a width W1 of the device isolation region 202c (second portion) is set narrower than a width W2 of the device isolation region 202b (first portion), and that the impurity concentration of the device isolation region 202c (second portion) is set equal to that of the device isolation region 202b (first portion). Since other respects are similar to those explained in FIG. 2, their explanation will be omitted.

Figure 7:
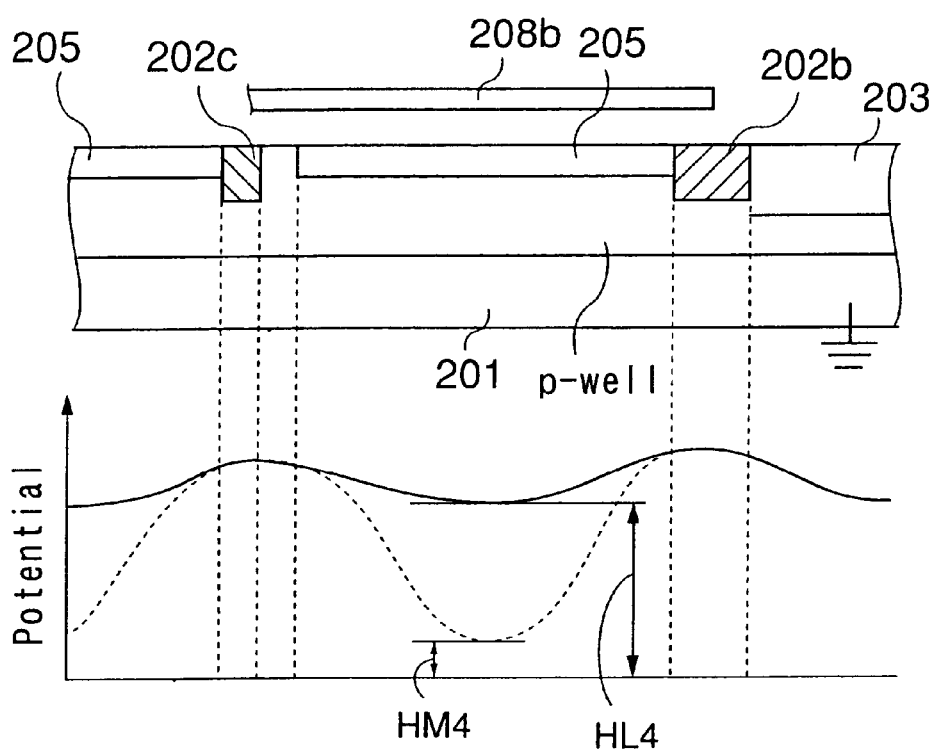
FIG. 7 is a view showing a sectional shape of the solid state imaging device shown in FIG. 6 according to the first embodiment of the present invention and a schematic behavior of potential in the sectional shape.

FIG. 7 is a view showing a C-D sectional shape of the solid state imaging device shown in FIG. 6 and a schematic behavior of potential in the sectional shape. It should be noted that the C-D sectional shape in FIG. 6 is one sectional shape in the region A (the second transfer region) shown in FIG. 6.

Also, a curve indicated by a solid line in FIG. 7 shows behavior of potential in the situation where the charges reside in the vertical charge transfer path 205 are transferred in the vertical direction. In this situation, the pulse voltage applied to the vertical charge transfer electrodes 208b is at the low level (VL). Then, a curve indicated by a broken line shows behavior of potential when the applied pulse voltage is at the middle level (VM).

Also, in FIG. 7, HL4 is a potential height of the vertical charge transfer paths 205 when the pulse voltage applied to the vertical charge transfer electrodes 208b is at the low level (VL). HM4 is a potential height of the vertical charge transfer paths 205 when the pulse voltage is at the middle level (VM).

If the width W1 of the device isolation region 202c (second portion) is narrowed in this manner, an amount of the impurity that is diffused from the device isolation region 202c to the vertical charge transfer paths 205 can be reduced. Accordingly, the narrow channel effect in the vertical charge transfer paths 205 in the region A (the second transfer region) is reduced.

Therefore, the HL4 and HM4 become substantially equal to HL1 and HM1 in FIG. 4A respectively. Accordingly, as explained by referring to FIG. 5, when the pulse voltage applied to the vertical charge transfer electrodes 208 is at the low level (VL), the convex portion cannot be formed in potential of the vertical charge transfer paths 205. Thus, it is possible to transfer smoothly the charges through the vertical charge transfer paths.

By the way, the width W1 of the device isolation region 202c (second portion) cannot be arbitrarily narrowed. That is, the width W1 of the device isolation region 202c must be decided to such extent that the potential of the device isolation region 202c is not reduced lower than the pinning potential of the vertical charge transfer paths 205. The reason for this will be omitted because it has been explained above.

It should be noted that the structure of the device isolation region to reduce the narrow channel effect is not limited to the above structure. For example, the impurity concentration of the device isolation region as the second portion may be set smaller than that in the device isolation region as the first portion, and the width of the device isolation region as the second portion in the row direction may be set narrower than that of the device isolation region as the first portion. With this structure, the similar operations and advantages to those explained above can be achieved.

In the first embodiment, the explanation is made while taking the vertical charge transfer electrode 208 having the one pixel-two electrode structure as an example, but the vertical charge transfer electrode is not limited to this. For example, if the vertical charge transfer electrode having a one pixel-four electrode structure is used in the alternative, the similar operations and advantages to those explained above can be achieved. Also, the drive system of the vertical charge transfer electrode is not limited to the four phase drive system explained above. For example, two phase drive system or the three phase drive system may be employed.

(2) Explanation of a Solid State Imaging Device Manufacturing Method According to a Second Embodiment of the Present Invention Next, the solid state imaging device manufacturing method according to the second embodiment of the present invention will be explained with reference to FIG. 8A to FIG. 12 hereunder.

FIGS. 8A, 8C, 8E and 8G are plan views showing a solid state imaging device manufacturing method according to the second embodiment of the present invention respectively. Then, FIGS. 8B, 8D, 8F and 8H are sectional views showing a sectional shape taken along a C-D line in FIGS. 8A, 8C, 8E and 8G respectively.

Figure 8A:
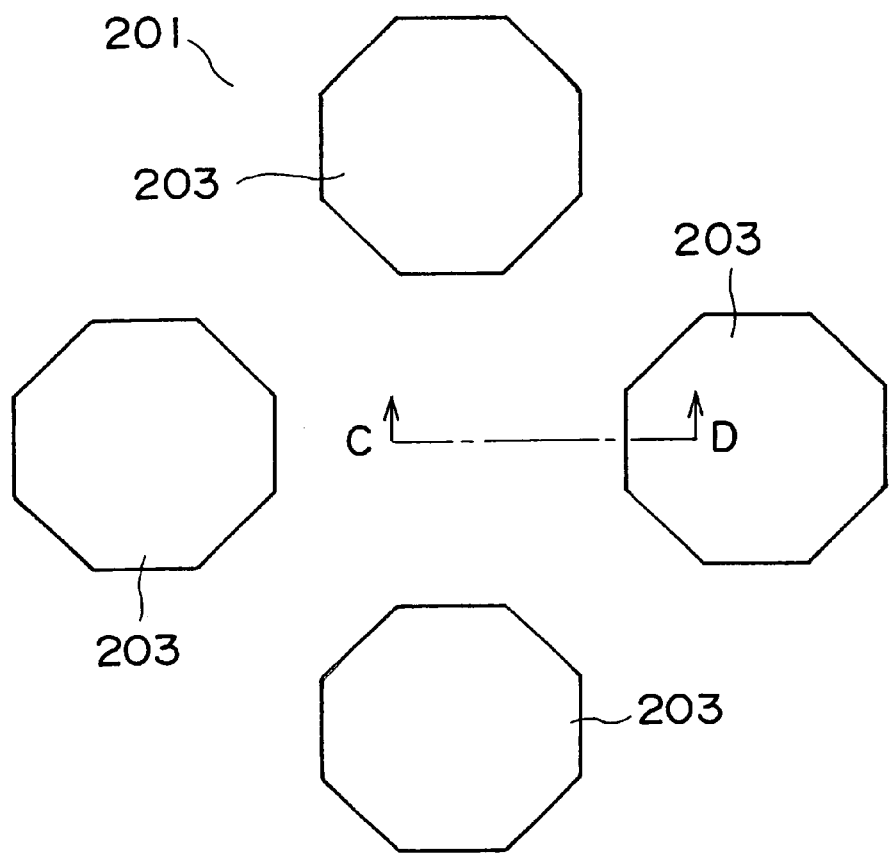
FIGS. 8A, 8C, 8E, and 8G are a plan view showing a solid state imaging device manufacturing method according to a second embodiment of the present invention respectively.
Figure 8B:
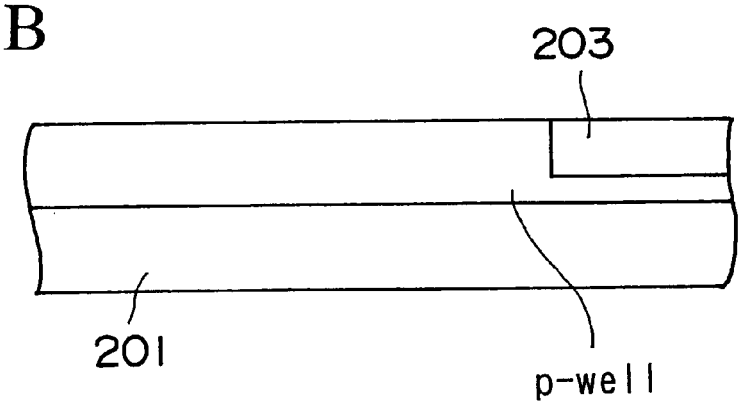
FIGS. 8B, 8D, 8F, and 8H are a sectional view showing a sectional shape taken along a C-D line in FIGS. 8A, 8C, 8E, and 8G respectively.

First, as shown in FIGS. 8A and 8B, the n-type semiconductor substrate 201 is prepared. A P-well is formed on the surface portion of the substrate 201, and photoelectric conversion devices 203 are formed on the p-well. In the second embodiment, a substrate is made up of the n-type semiconductor substrate 201 and the p-well.

Figure 8C:
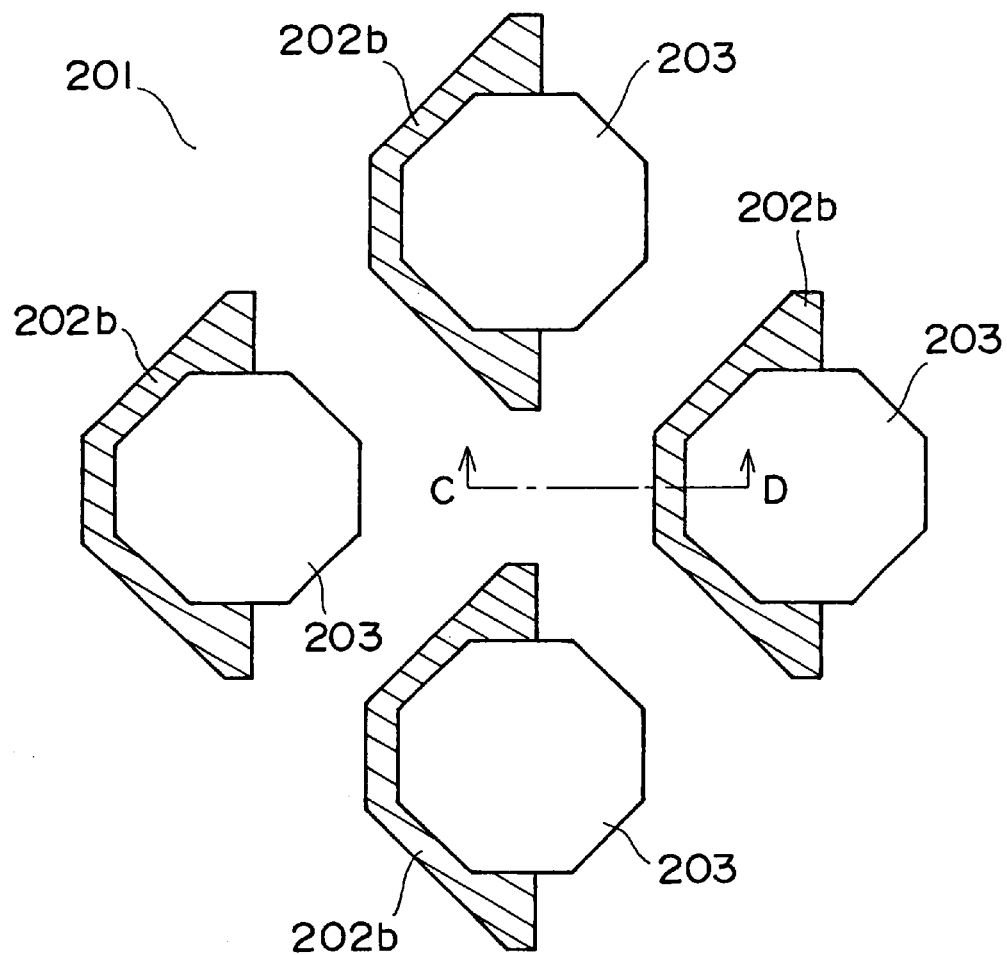
Figure 8D:
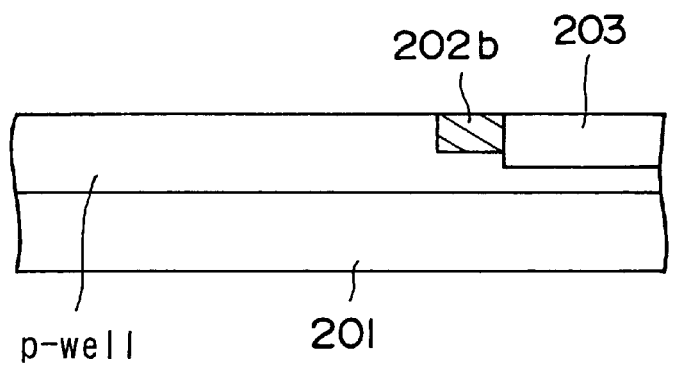

Then, as shown in FIGS. 8C and 8D, the device isolation region 202b (first portion) that is in contact with one side portion 203a (see FIG. 2) of the photoelectric conversion device 203 is formed. The device isolation region 202b (first portion) is made up of the high concentration p-type semiconductor layer (first conductivity type semiconductor layer), and is formed by doping B (boron, which is an example of the first impurity), into the substrate using the ion implantation. This ion implantation is performed by coating photoresist (not shown), which has the opening only in the area corresponding to the device isolation region 202b (first portion) but does not have the opening in other areas, on the substrate and then doping B (boron) into the substrate body in the area corresponding to the device isolation region 202b via the opening.

Figure 8E:
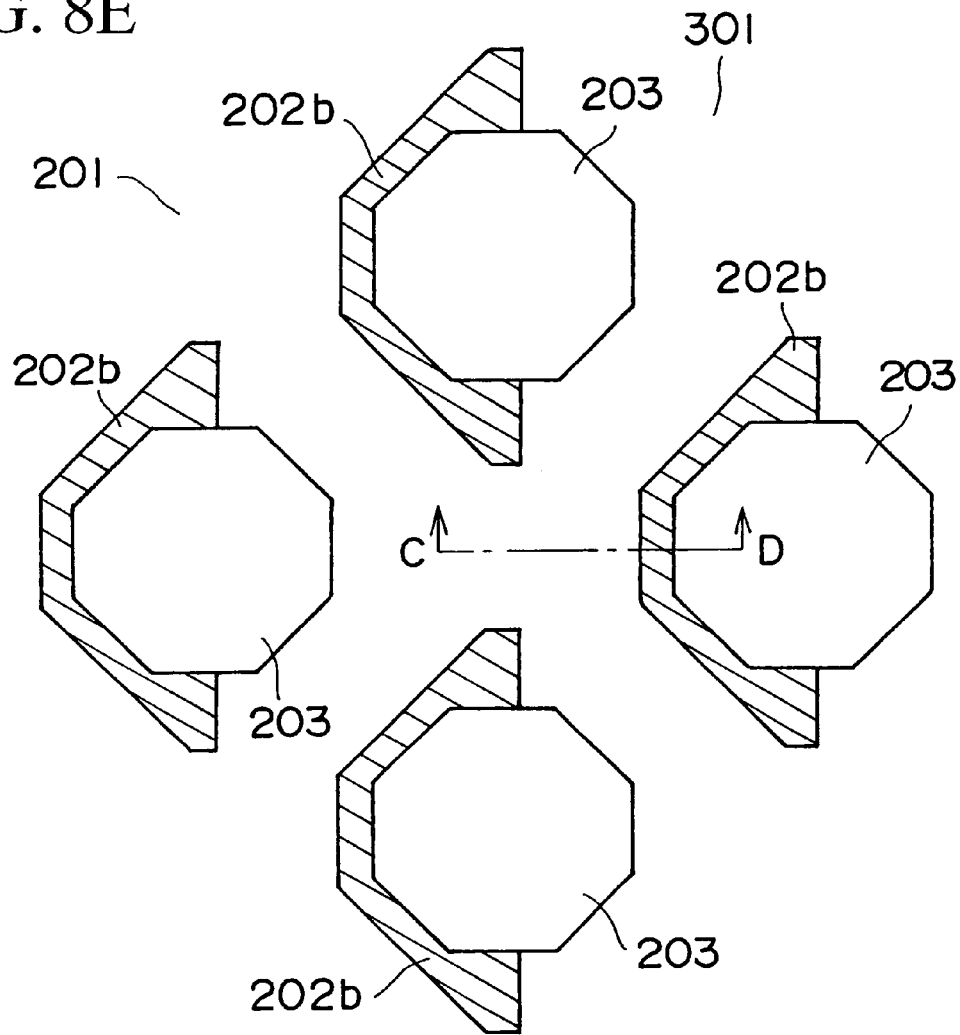
Figure 8F:
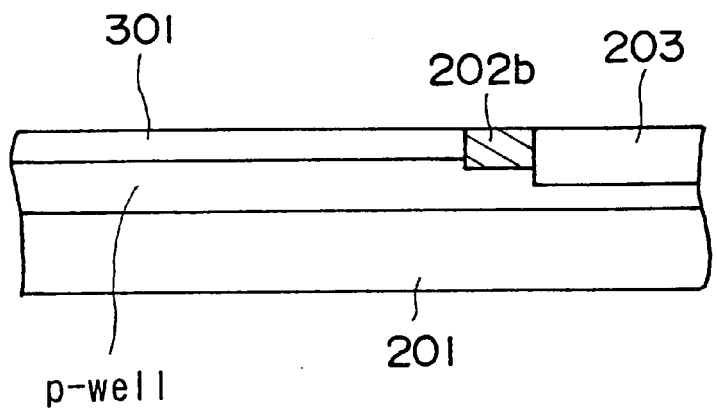

Then, as shown in FIGS. 8E and 8F, the n-type semiconductor layer 301 (second conductivity type semiconductor layer) is formed on the substrate in the area where the photoelectric conversion devices 203 and the device isolation region 202b are not formed. This layer 301 is formed by forming the photoresist (not shown), in which no opening is formed in the area corresponding to the photoelectric conversion devices 203 and the device isolation region 202b but other areas are opened, on the substrate and then doping P (phosphorus, which is an example of the second impurity) into the substrate via the openings using the ion implantation.

Figure 8G:
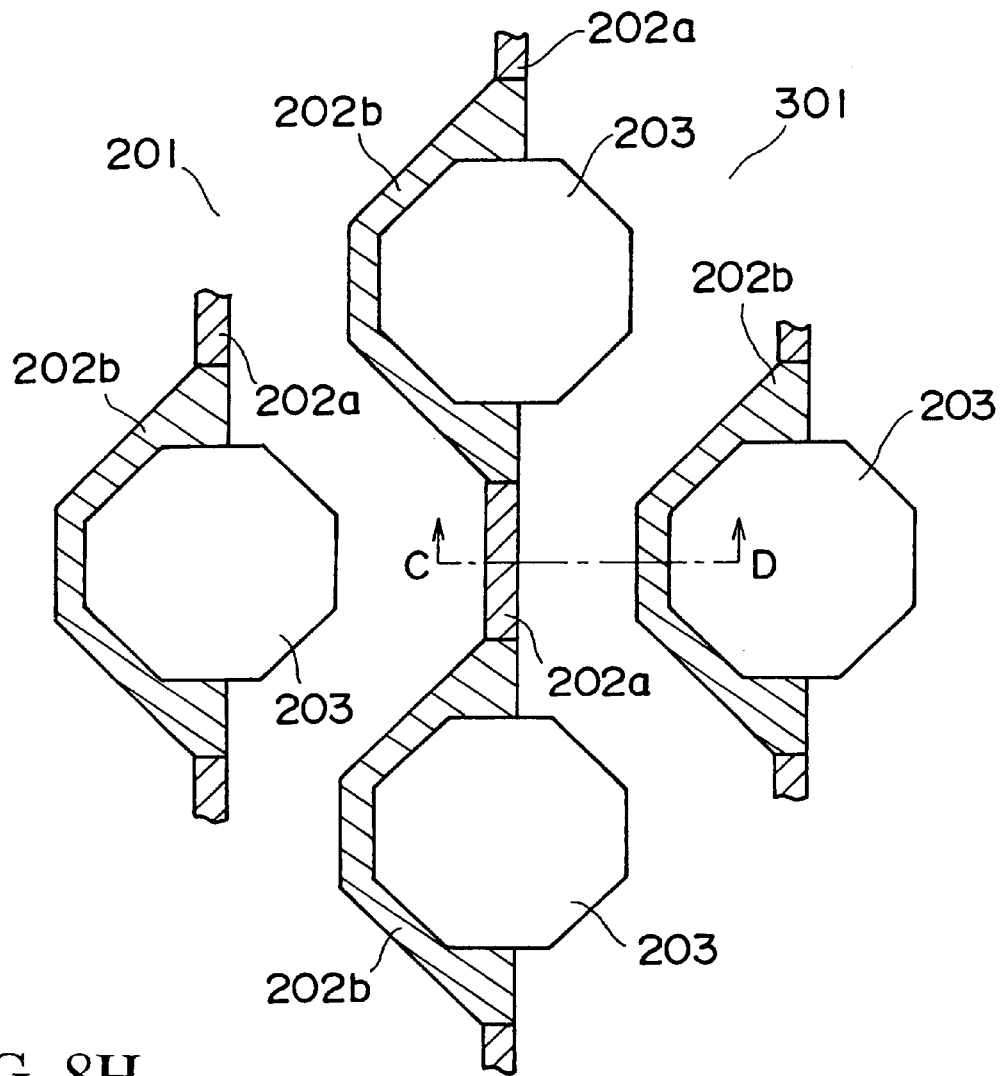
Figure 8H:
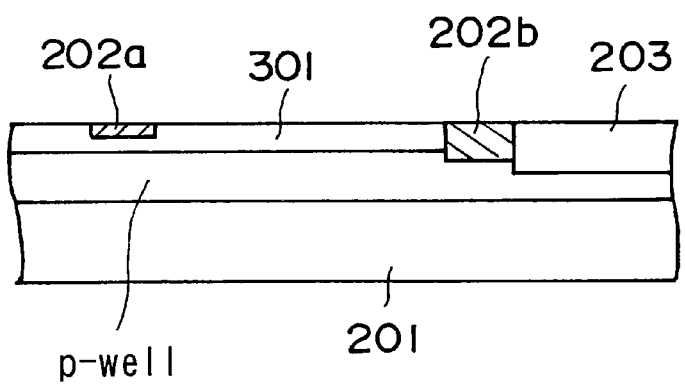

Then, as shown in FIGS. 8G and 8H, the device isolation region 202a (second portion) is formed. This device isolation region 202a (second portion) is formed by forming the photoresist (not shown), which has the opening only in the area corresponding to the device isolation region 202a, on the semiconductor substrate 201 and then doping B (boron, which is an example of the first impurity) into the substrate via the opening using the ion implantation.

Up to this step, the vertical charge transfer paths 205 (see FIG. 2) whose one side or both sides are defined by the first portion 202b and the second portion 202a are formed.

Here, as shown in FIG. 8H, the underlying n-type semiconductor layer 301 (second conductivity type semiconductor layer) is formed in the area into which B (boron) is ion-implanted to form the device isolation region 202a (second portion). Therefore, since B (boron) as an acceptor and P (phosphorus) as a donor are compensated with each other in the above ion-implanted area, the overall substantial acceptor concentration is lowered in this area. Accordingly, if the ion implantation is performed in the manner as above, device isolation region 202a (second portion) whose impurity concentration is lowered can be formed on the substrate.

Therefore, as explained in the first embodiment, the narrow channel effect of the vertical charge transfer paths 205 in the area (the region A in FIG. 2), in which the device isolation region 202a (second portion) and the device isolation region 202b (first portion) are formed on both sides of the vertical charge transfer paths 205, can be reduced.

By the way, the device isolation region 202a as the second portion may be formed as follows by the method different from the above manufacturing method.

Figure 8I:
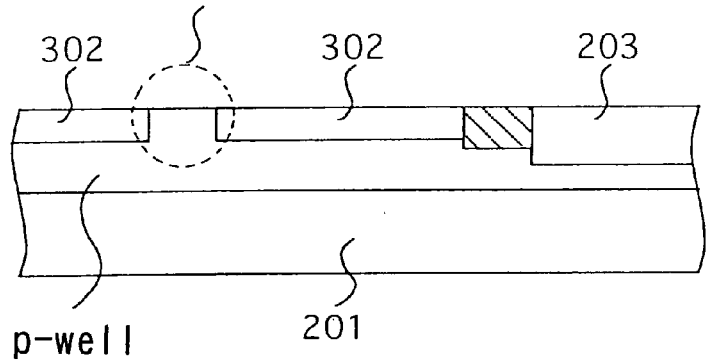
FIGS. 8I and 8J are sectional views showing a solid state imaging device manufacturing method that is different from the present invention.
Figure 8J:
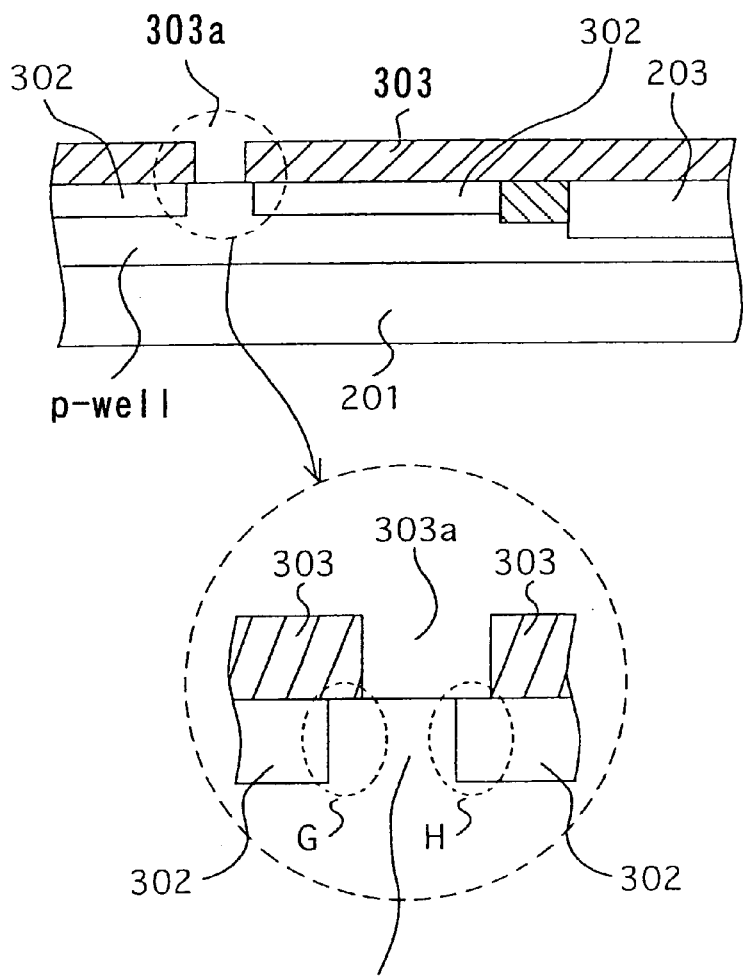

FIGS. 8I and 8J are sectional views showing a solid state imaging device manufacturing method that is applied when the device isolation region 202a (second portion) is formed by the method different from the above-mentioned method. In this manufacturing method, after the steps shown in FIGS. 8C and 8D, the n-type semiconductor layer 302 is not formed in the area corresponding to the device isolation region 202a (second portion) (see FIG. 8I).

Then, as shown in FIG. 8J, the opening portion 303a is formed in the area of the photoresist 303 corresponding to the device isolation region 202a by coating the photoresist 303 on the overall surface and then exposing/developing the photoresist 303 via the mask (not shown).

Then, the device isolation region 202a is formed by ion-implanting B (boron) into the p-well via the opening portion 303a.

It should be noted that, in the step shown in FIG. 8J, if the alignment precision of the mask (not shown) is not good, the area corresponding to the device isolation region 202a (second portion) and the opening portion 303a are displaced mutually as shown in a circle indicated by a broken line of FIG. 8J.

If B (boron) is ion-implanted under this situation, there is a possibility that in some areas B (boron) cannot be ion-implanted at a desired concentration as indicated by broken-line circles G, H in FIG. 8J. That is, in the broken-line circle G, since the photoresist 303 extends into the upper portion, B (boron) cannot be ion-implanted. On the contrary, in the broken-line circle H, since the photoresist 303 is not formed on the upper portion, ion-implanted B (boron) and P (phosphorus) contained in the n-type semiconductor layer 302 are cancelled with each other. Thus, the substantial donor concentration in this area becomes low rather than the n-type semiconductor layer 302 in other areas.

In contrast, if the device isolation region 202a (second portion) is formed by the solid state imaging device manufacturing method (FIGS. 8A to 8H) according to the second embodiment, the above problem is not caused. That is, in the second embodiment, there is no necessity that the opening portion 303a of the photoresist 303 should be aligned with the area of the n-type semiconductor layer 302 that corresponds to the device isolation region 202a (second portion). As a result, in contrast to the manufacturing method shown in FIGS. 8I and 8J, according to the solid state imaging device manufacturing method of the second embodiment, the alignment precision between the mask used when exposing the photoresist and the semiconductor substrate 201 can be relaxed.

(3) Explanation of a Solid State Imaging Device According to a Third Embodiment of the Present Invention Next, the solid state imaging device according to the third embodiment will be explained with reference to the drawings hereunder.

A plan view of the overall solid state imaging device according to the third embodiment is similar to FIG. 1 explained above.

Figure 9:
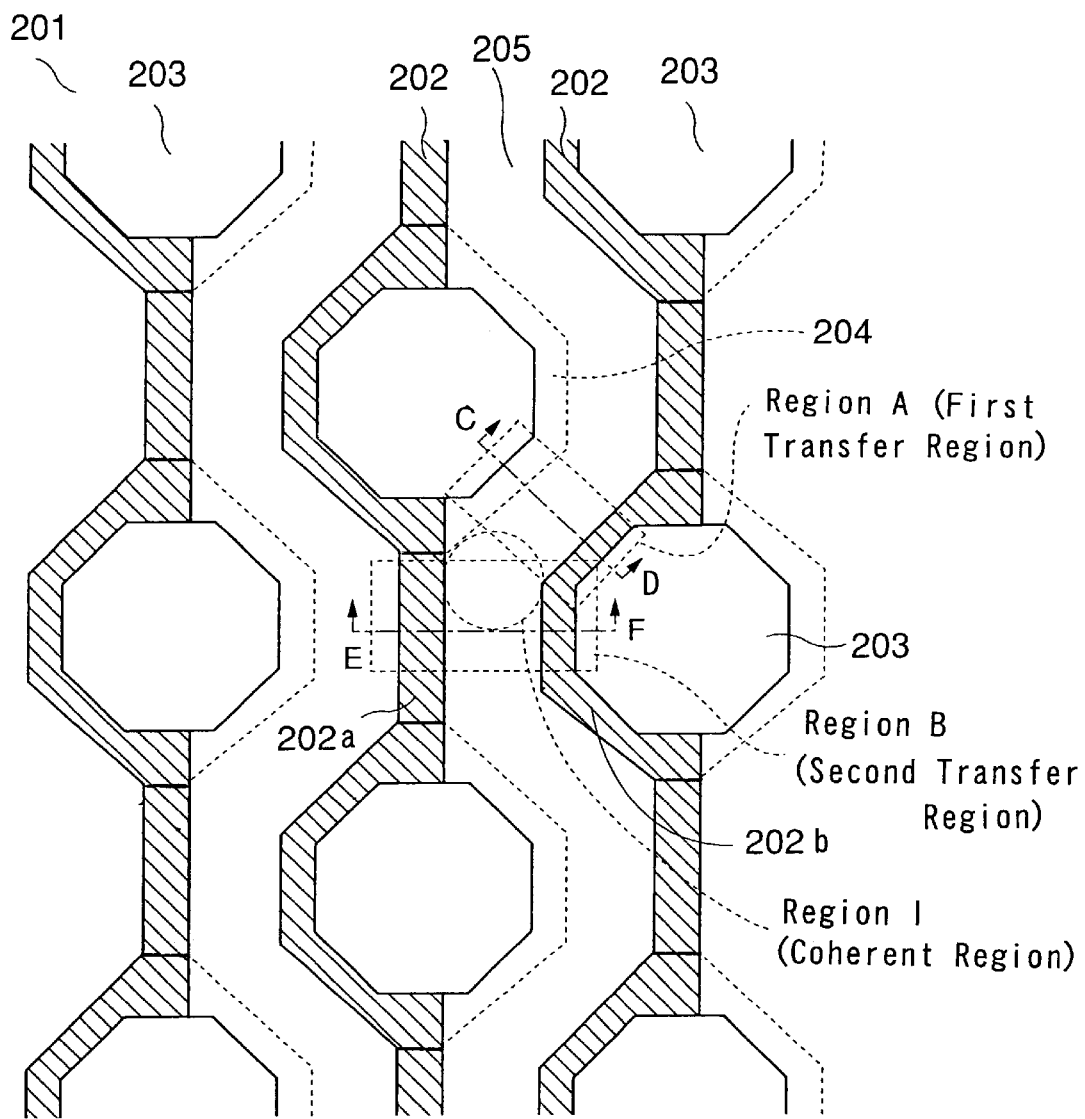
FIG. 9 is an enlarged view showing a pertinent portion of a solid state imaging device according to a third embodiment of the present invention.

FIG. 9 is an enlarged view showing a pertinent portion of the solid state imaging device according to the third embodiment shown in FIG. 1. In FIG. 9, the constituent members that are the same as in FIG. 1 are affixed with the same reference numeral and their explanation is omitted in the followings.

While paying the attention to the region A in FIG. 9, the device isolation region 202b is formed on only one side of the vertical charge transfer path 205 in this region. In other words, one side of the vertical charge transfer path 205 in the region A is defined by contacting to the device isolation region 202b. The vertical charge transfer path 205 in the region A is called a first transfer region hereunder.

In contrast, while paying the attention to the region B in FIG. 9, the device isolation region is formed on both sides of the vertical charge transfer path 205 in the region B. That is, the device isolation region 202b is formed on one side (right-hand side in FIG. 9) of the vertical charge transfer path 205, and the device isolation region 202a is formed on the other side (left-hand side in FIG. 9) of the vertical charge transfer path 205. In other words, both sides of the vertical charge transfer path 205 in the region B are defined by contacting to the device isolation regions 202a and 202b respectively. The vertical charge transfer path in the region B is called a second transfer region hereunder.

Then, the first transfer region and the second transfer region are connected via the region I in FIG. 9. As shown in FIG. 9, this region I is positioned at downward of the first transfer region. The region I is called a coherent region in the followings. In addition, the region 202b that defines one sides of the first transfer region and the second transfer region is bent in the neighborhood of the coherent region.

Figure 10:
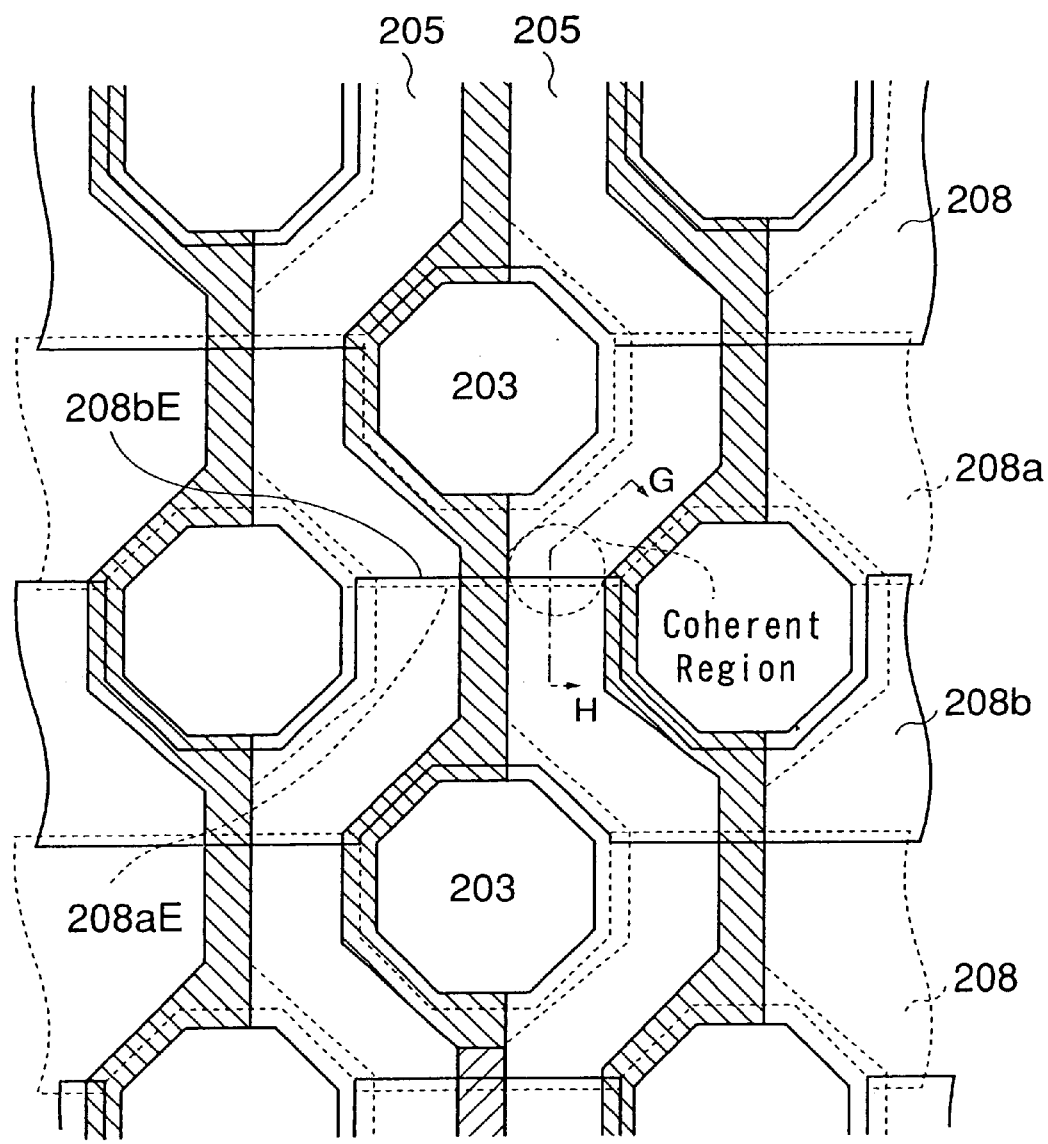
FIG. 10 is a view showing the solid state imaging device shown in FIG. 9 according to the third embodiment of the present invention to which vertical charge transfer electrodes are provided.
Figure 17:
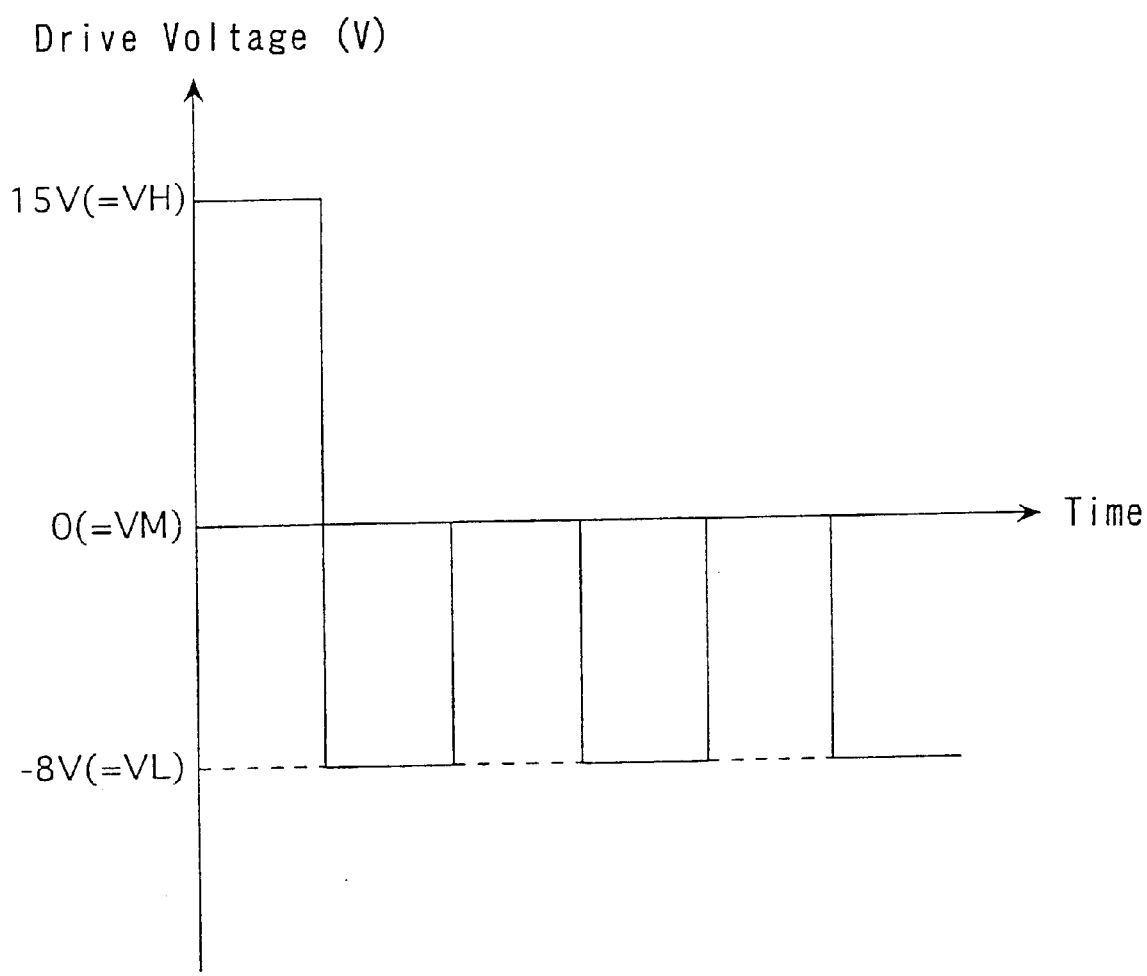
FIG. 17 is a view showing an example of a drive pulse that is applied to the vertical charge transfer electrodes.
Figure 18A:
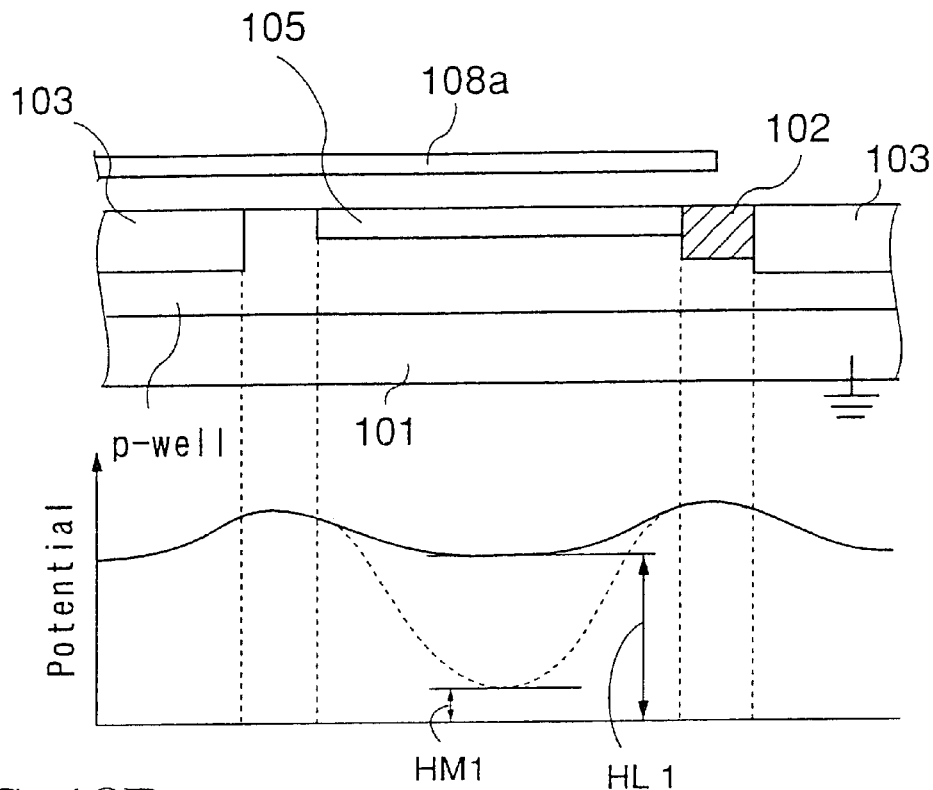
FIG. 18A is a view showing a sectional shape of the solid state imaging device in the prior art, taken along a C-D line in FIG. 15, and a schematic behavior of potential in the sectional shape.
Figure 18B:
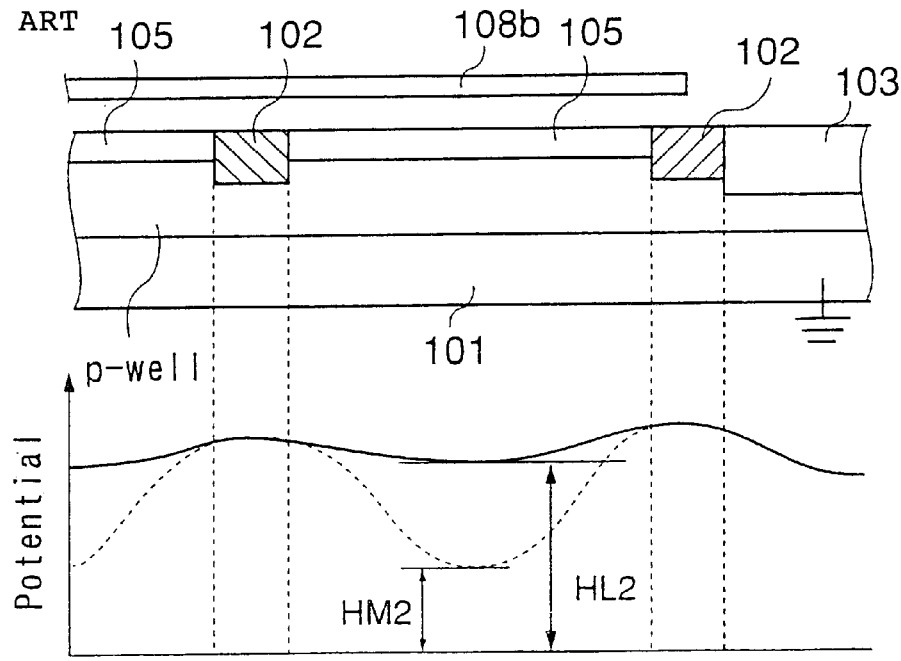
FIG. 18B is a view showing a sectional shape of the solid state imaging device in the prior art, taken along an E-F line in FIG. 15, and a schematic behavior of potential in the sectional shape.
Figure 19:
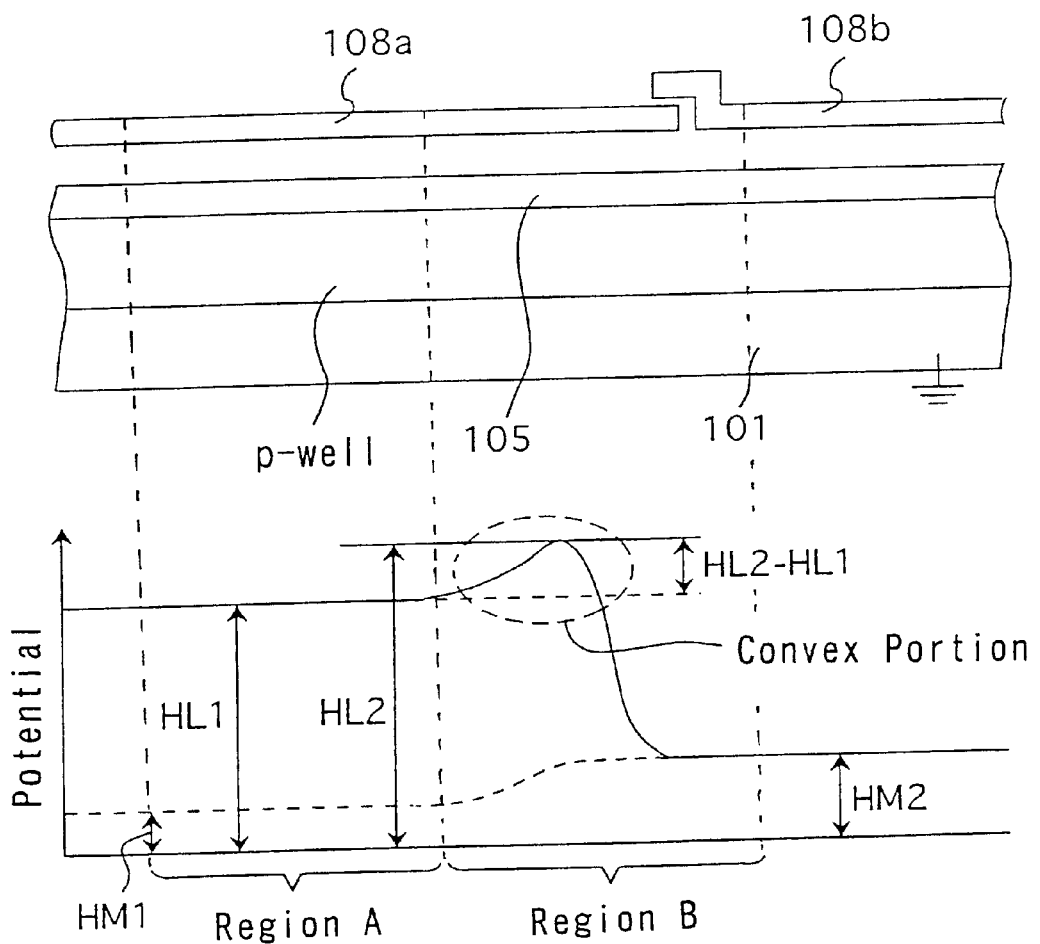
FIG. 19 is a view showing a sectional shape of the solid state imaging device in the prior art, taken along a G-H line in FIG. 16, and a schematic behavior of potential in the sectional shape.

FIG. 10 shows the solid state imaging device shown in FIG. 9 to which the vertical charge transfer electrodes 208 (208a, 208b) being omitted in FIG. 9 are provided. As shown in FIG. 9, the vertical charge transfer electrodes 208 are formed integrally in the row direction (horizontal direction in FIG. 9) and also formed in plural in the column direction (vertical direction in FIG. 9). These vertical charge transfer electrodes 208 have the well-known one pixel-two electrodes structure. That is, two vertical charge transfer electrodes 208a and 208b are provided between the photoelectric conversion devices 203 positioned adjacent in the column direction. Then, four phase drive pulse as shown in FIG. 17 is applied to these vertical charge transfer electrodes 208.

Figure 11A:
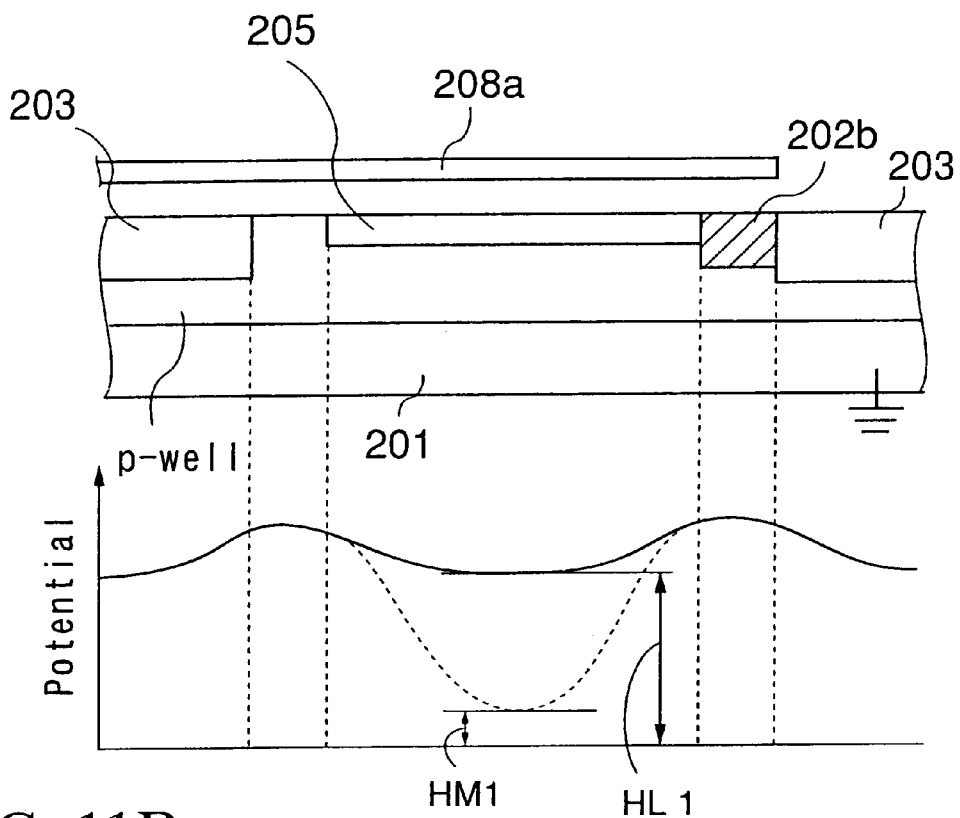
FIG. 11A is a view showing a sectional shape of the solid state imaging device according to the third embodiment of the present invention, taken along a C-D line in FIG. 9, and a schematic behavior of potential in the sectional shape.
Figure 11B:
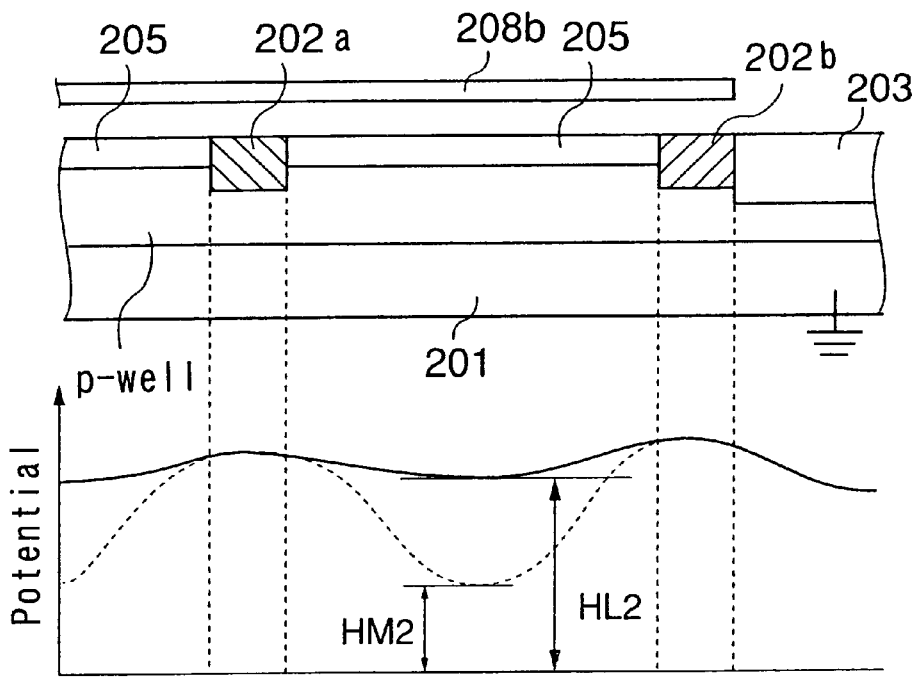
FIG. 11B is a view showing a sectional shape of the solid state imaging device according to the third embodiment of the present invention, taken along an E-F line in FIG. 9, and a schematic behavior of potential in the sectional shape.

FIG. 11A is a view showing a sectional shape of the solid state imaging device according to the third embodiment of the present invention, taken along a C-D line in FIG. 9, and a schematic behavior of potential in the sectional shape. FIG. 11B is a view showing a sectional shape of the solid state imaging device according to the third embodiment of the present invention, taken along an E-F line in FIG. 9 and a schematic behavior of potential in the sectional shape. In FIGS. 11A and 11B, the vertical charge transfer electrodes 208a and 208b being omitted in FIG. 9 are also illustrated. Then, as shown in FIG. 9, a C-D sectional shape is one sectional shape in the first transfer region, and an E-F sectional shape is one sectional shape in the second transfer region.

Also, the curves indicated by a solid line in FIGS. 11A and 11B show the potential when the voltage applied to the vertical charge transfer electrodes 208a and 208b is at the low level (VL) respectively, and the curves indicated by a broken line show the potential when the applied voltage is at the middle level (VM) respectively.

As shown in FIG. 11A, the height of potential of the vertical charge transfer path 205 in the C-D sectional shape is HL1 when the voltage applied to the vertical charge transfer electrode 208a is at the low level (VL), and the height of potential is HM1 when the voltage is at the middle level (VM).

Also, as shown in FIG. 11B, the height of potential of the vertical charge transfer path 205 in the E-F sectional shape is HL2 when the voltage applied to the vertical charge transfer electrode 208b is at the low level (VL), and the height of potential is HM2 when the voltage is at the middle level (VM).

Then, HL2 is higher than HL1 and HM2 is higher than HM1. The reason for this is similar to that explained in the background of the invention.

More specifically, the device isolation region 202b is formed on one side of the first transfer region whereas the device isolation regions 202a and 202b are formed on both sides of the second transfer region. Therefore, an amount of the impurity (B (boron)) diffused from the device isolation region 202 to the vertical charge transfer path 205 in the second transfer region becomes larger than that in the first transfer region. Accordingly, because of the narrow channel effect due to the diffusion of the impurity, a height of potential in the second transfer region becomes higher than that in the first transfer region.

It should be noted here that the difference in the height of the potential can also be caused by the bended formation of the device isolation region 202b in the coherent region.

That is, it may be considered that, since the device isolation region 202b is bent in this manner, a width of the second transfer region is narrower than that of the first transfer region and thus the narrow channel effect in the second transfer region is increased rather than the first transfer region.

Here, two sheets of the vertical charge transfer electrodes 208a and 208b shown in FIG. 10 will be considered. A reference numeral 208aE in FIG. 10 denotes one edge portion of the vertical charge transfer electrode 208a, and a reference numeral 208bE denotes one edge portion of the vertical charge transfer electrode 208b.

As shown in FIG. 10, these vertical charge transfer electrodes 208a and 208b are arranged in such a way that one edge portions 208aE and 208bE are positioned in the neighborhood of the above coherent region.

Arranging the vertical charge transfer electrodes 208 in this manner, the convex portion of potential that appears in vicinity of the coherent region in the prior art is not formed. This point will be explained with reference to FIG. 12 hereunder.

Figure 12:
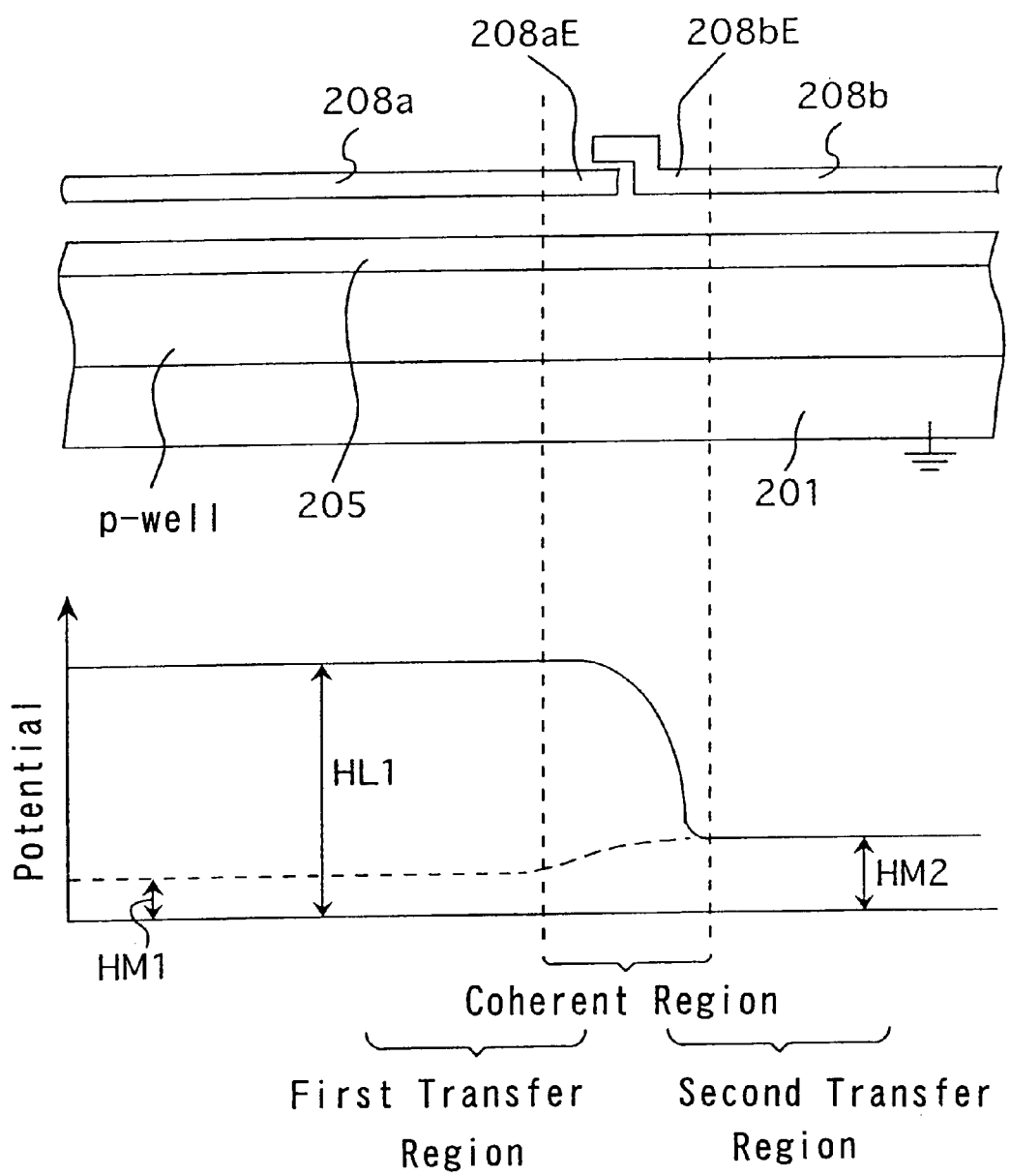
FIG. 12 is a view showing a sectional shape of the solid state imaging device according to the third embodiment of the present invention, taken along a G-H line in FIG. 10, and a schematic behavior of potential in the sectional shape.

FIG. 12 is a view showing a sectional shape of the solid state imaging device taken along a G-H line in FIG. 10 and a schematic behavior of potential of the vertical charge transfer path 205 in the sectional shape. Then, a curve indicated by a solid line in FIG. 12 shows behavior of potential in the G-H sectional shape when the voltage applied to the vertical charge transfer electrode 208a is at the low level (VL) and the voltage applied to the vertical charge transfer electrode 208b is at the middle level (VM). Also, a curve indicated by a broken line in FIG. 12 shows behavior of potential when both voltages applied to the vertical charge transfer electrode 208a and 208b are at the middle level (VM).

Here, consider the situation where the voltage applied to the vertical charge transfer electrode 208a is at the low level (VL) and the voltage applied to the vertical charge transfer electrode 208b is at the middle level (VM).

In general, it has been know that when the voltage is applied to a conductor, a stronger electric field (fringing electric field) is generated around some surfaces of the conductor if the surfaces have lager curvature compared to other surfaces of the conductor.

As explained above, one edge portion 208bE of the vertical charge transfer electrode 208b is arranged in vicinity of the coherent region. This one edge portion 208bE of the vertical charge transfer electrode 208b has a larger curvature in its sectional shape than other portions of the vertical charge transfer electrode 208b.

For this reason, when the voltage of the middle level VM is applied to the vertical charge transfer electrode 208b, the fringing electric field is generated around one edge portion 208bE of the vertical charge transfer electrode 208b. Then, the potential around one edge portion 208bE is reduced by this fringing electric field in contrast to the case where no fringing electric field is generated.

Accordingly, since the convex portion of potential that appears in vicinity of the coherent region in the prior art is canceled by this fringing electric field, such convex portion of potential is not formed in the neighborhood of the coherent region.

Figure 13:
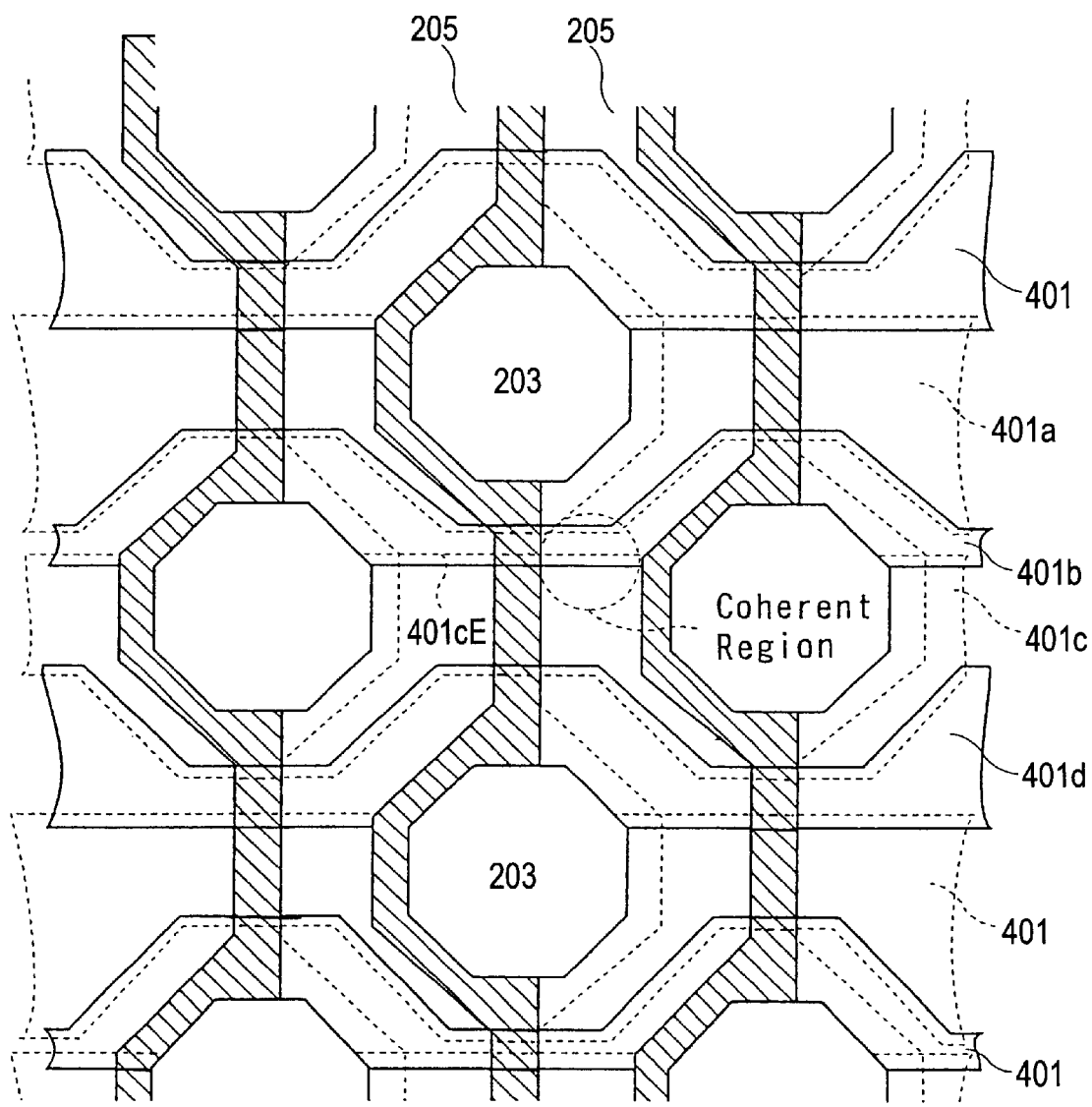
FIG. 13 is a view showing the solid state imaging device shown in FIG. 9 according to the third embodiment of the present invention to which vertical charge transfer electrodes having a one pixel-four electrodes structure are provided.
Figure 14:
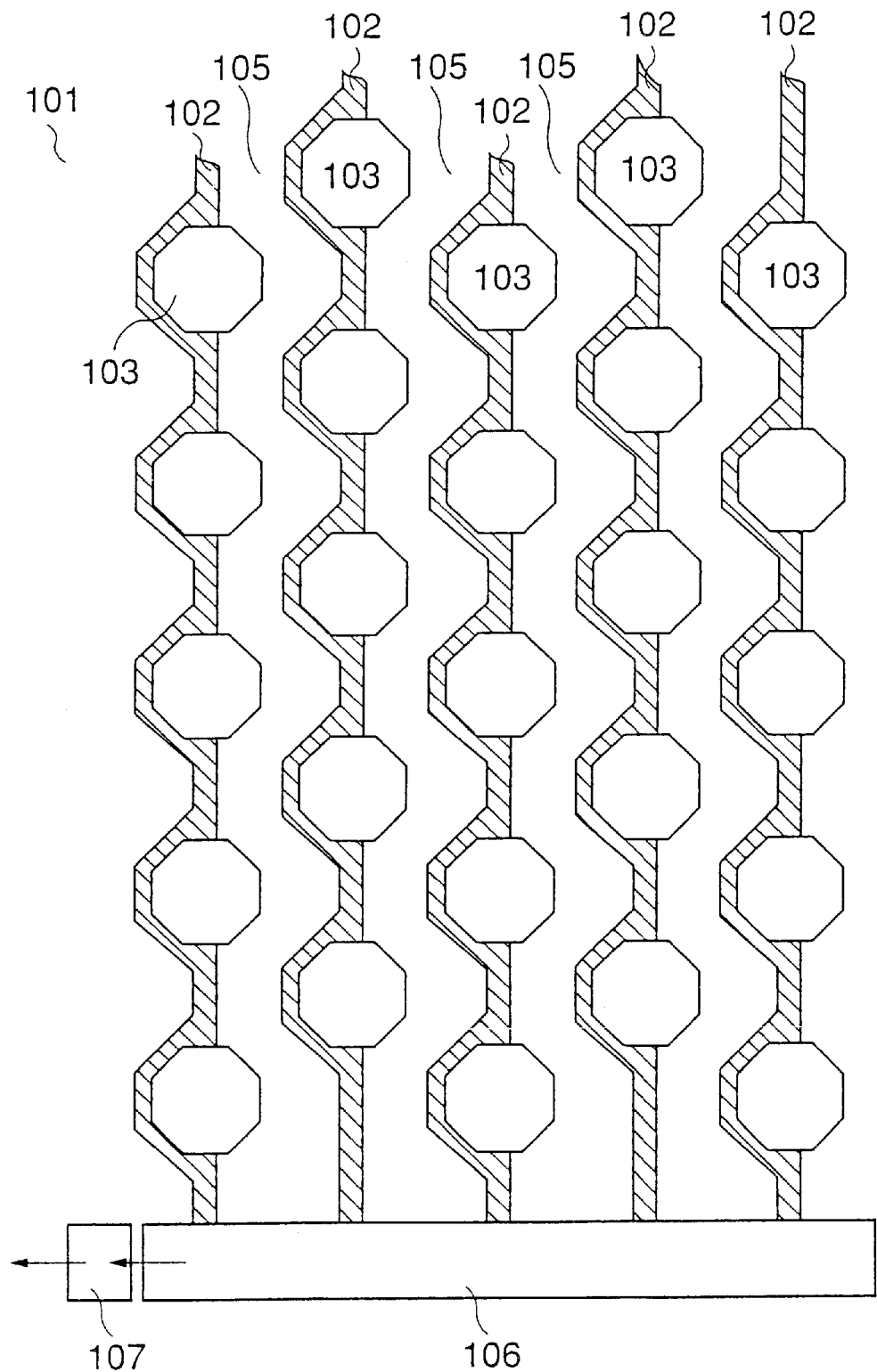
FIG. 14 is a plan view showing an overall solid state imaging device in the prior art.
Figure 15:
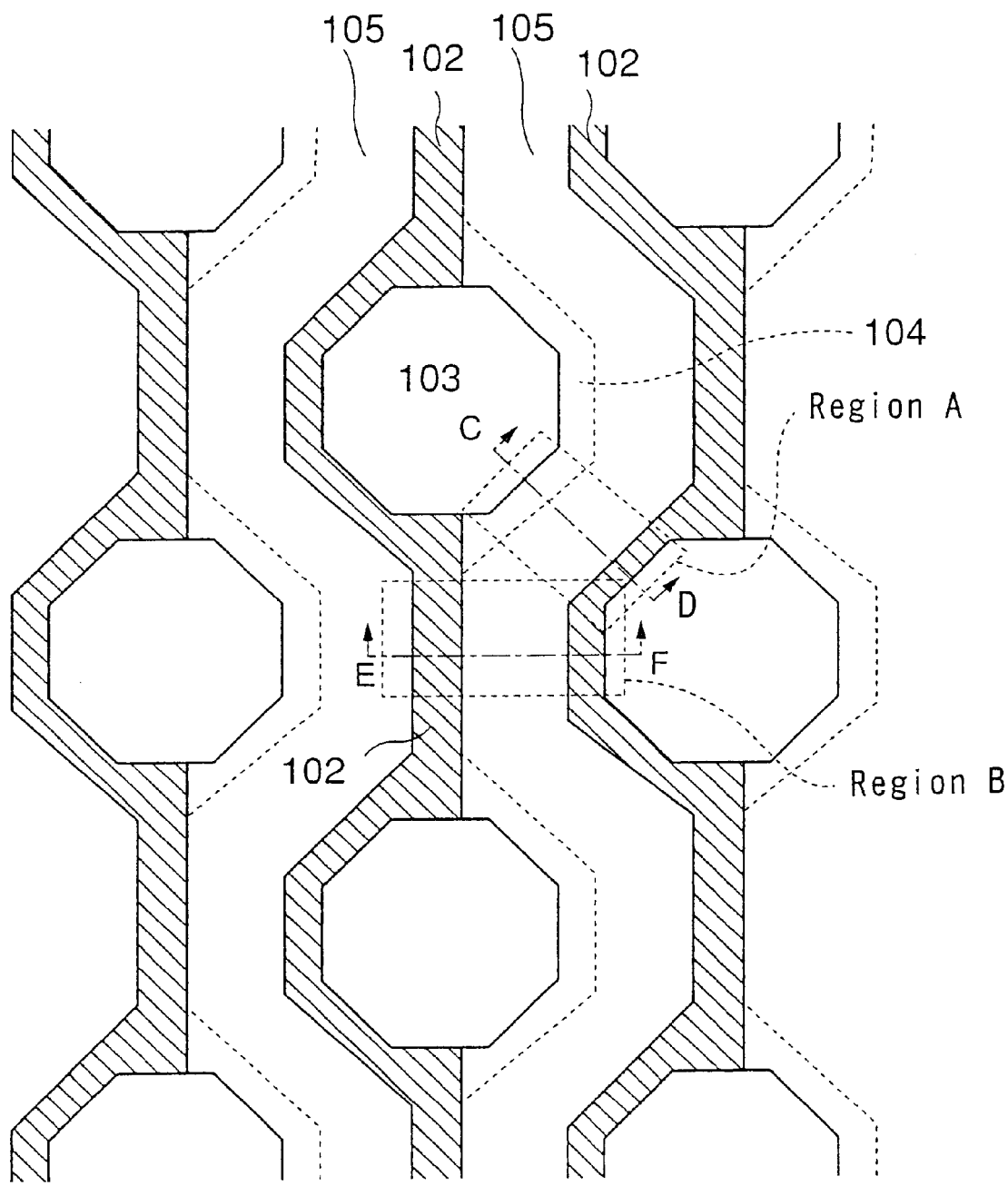
FIG. 15 is an enlarged view showing a pertinent portion of the solid state imaging device in the prior art.
Figure 16:
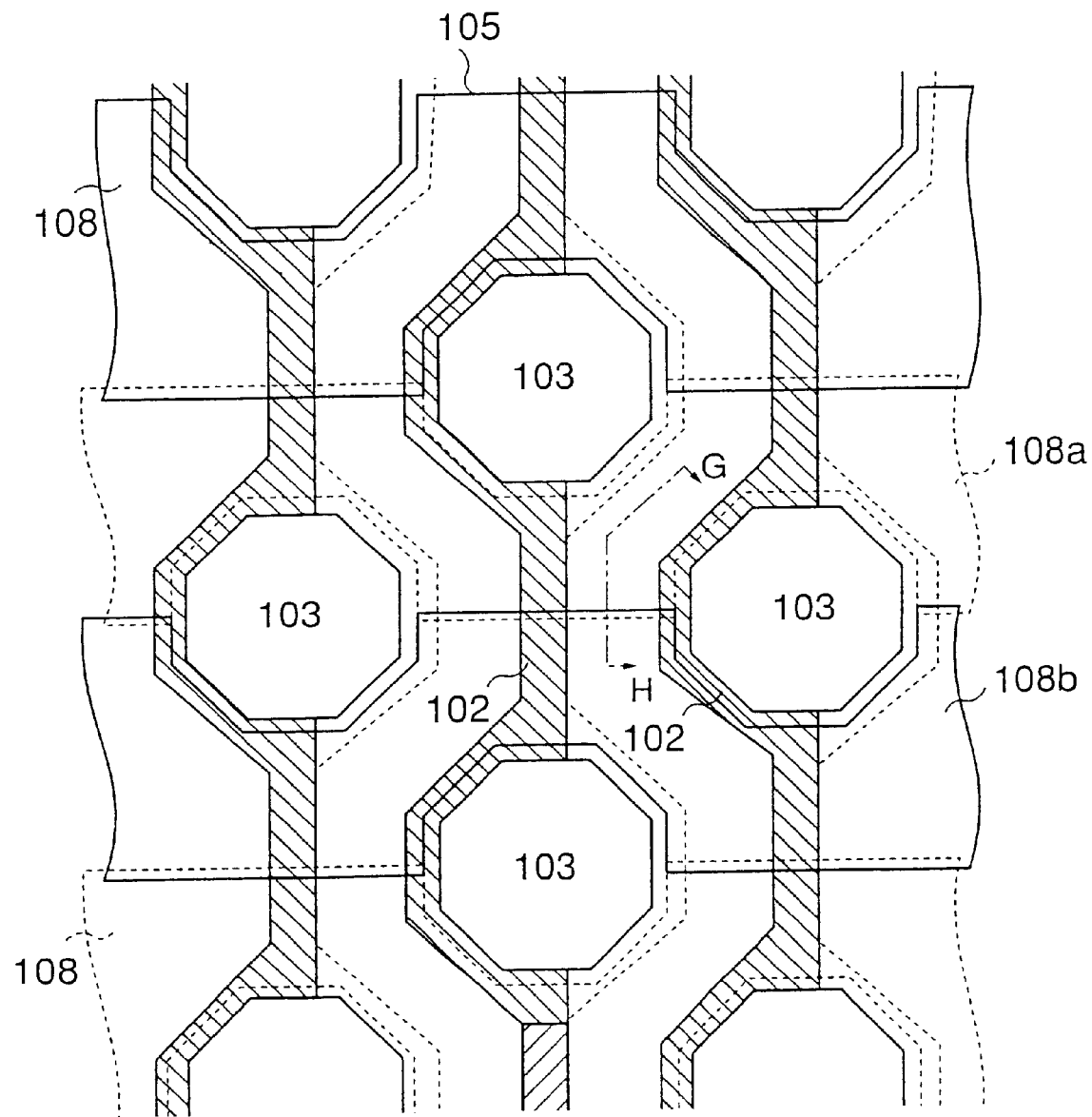
FIG. 16 is a view showing the solid state imaging device shown in FIG. 15 in the prior art to which the vertical charge transfer electrodes are provided.

Though the one pixel-two electrodes structure is explained in the above, a one pixel-four electrodes structure as shown in FIG. 13 may be employed alternatively to achieve such operation and advantage.

FIG. 13 shows the solid state imaging device shown in FIG. 9 to which vertical charge transfer electrodes 401 having a one pixel-four electrodes structure are provided. In the solid state imaging device shown in FIG. 13, four vertical charge transfer electrodes 401a, 401b, 401c, and 401d are provided between the adjacent photoelectric conversion devices 203 in the column direction. Then, one edge portion 401cE of the vertical charge transfer electrode 401c is arranged near the coherent region.

Accordingly, as explained above, the fringing electric field from one edge portion 401cE can cancel the convex portion of potential, so that no convex portion of potential is formed on the vertical charge transfer path.

Therefore, the situation where the convex portion of potential disturbs the motion of the charges in the vertical charge transfer path 205 cannot arise. Thus, a vertical transfer efficiency of the solid state imaging device can be improved in this embodiment. Also, because the vertical transfer efficiency can be improved, the overall characteristic of the solid state imaging device can be improved.

In the first and third embodiment, the four phase drive pulse is used as the drive pulse applied to the vertical charge transfer electrodes. However, the drive pulse is not limited to this. For example, if the two phase drive pulse or the three phase drive pulse is used in the alternative, the operation and advantage similar to those in the first and third embodiment can be attained.

What is claimed is:

1. A solid state imaging device comprising:
   a semiconductor substrate;
   a plurality of photoelectric conversion devices formed on the semiconductor substrate at predetermined intervals in a column direction and a row direction respectively;
   a plurality of device isolation regions formed on the semiconductor substrate where the device isolation regions contain first conductivity type semiconductor layer and extend in a zigzag and substantially in the column direction to pass through between the photoelectric conversion devices; and
   a plurality of vertical charge transfer paths formed between the adjacent device isolation regions on the semiconductor substrate where the vertical charge transfer paths contain second conductivity type semiconductor layer and extend in a zigzag and substantially in the column direction to pass through between the photoelectric conversion devices,
   wherein the vertical charge transfer path has at least (i) a portion whose both sides are defined-by the device isolation regions and (ii) a portion whose only one side is defined by the device isolation regions, and
   a width of the device isolation regions defining the both sides is narrower than that of the device isolation regions defining the only one side, so that a narrow channel effect in the portions of the vertical charge transfer paths, whose both sides are defined, can be reduced.

2. A solid state imaging device according to claim 1, wherein an impurity concentration of the device isolation regions defining the both sides is lower than that of the device isolation regions defining the only one side.

3. A solid state imaging device comprising:
   a semiconductor substrate;
   a plurality of photoelectric conversion devices formed on the semiconductor substrate at predetermined intervals in a column direction and a row direction respectively;
   columnar vertical charge transfer paths extended to pass through between the plurality of photoelectric conversion devices;

columnar device isolation regions extended to pass through between the plurality of photoelectric conversion devices; and a plurality of vertical charge transfer electrodes formed over the vertical charge transfer paths, for transferring charges in the vertical charge transfer paths toward a downward of the vertical charge transfer paths when a predetermined drive pulse is applied;

wherein the vertical charge transfer path has at least (i) a first transfer portion whose only one side is defined by contacting the device isolation regions and (ii) a second transfer portions whose both sides are defined by contacting the device isolation regions, the first transfer portions and the second transfer portions are connected in coherent regions located in a downward of the first transfer portions, and the vertical charge transfer electrodes are arranged in such a way that one edge portions of the vertical charge transfer electrode is positioned over the vertical charge transfer path in the coherent regions.

4. A solid state imaging device according to claim 3, wherein the device isolation regions that define one sides of the first transfer portions and the second transfer portions are bent in the coherent regions.

* * * * *